(12) United States Patent
Muraho et al.

(10) Patent No.: US 11,133,795 B2
(45) Date of Patent: Sep. 28, 2021

(54) OVERCURRENT DETERMINING APPARATUS AND DRIVE UNIT USING THE SAME

(71) Applicant: DENSO CORPORATION, Kariya (JP)

(72) Inventors: Tomoyuki Muraho, Kariya (JP); Yohei Kondo, Kariya (JP)

(73) Assignee: DENSO CORPORATION, Kariya (JP)

( * ) Notice: Subject to any disclaimer, the term of this patent is extended or adjusted under 35 U.S.C. 154(b) by 467 days.

(21) Appl. No.: 16/180,164

(22) Filed: Nov. 5, 2018

(65) Prior Publication Data

US 2019/0137547 A1    May 9, 2019

(30) Foreign Application Priority Data

Nov. 6, 2017    (JP) .............................. JP2017-214168

(51) Int. Cl.

| | |
|---|---|
| *H03K 17/0812* | (2006.01) |
| *G01R 19/165* | (2006.01) |
| *H03K 17/06* | (2006.01) |
| *H02H 3/087* | (2006.01) |
| *H02M 1/08* | (2006.01) |
| *H02M 1/32* | (2007.01) |
| *H02H 3/08* | (2006.01) |
| *H03K 17/14* | (2006.01) |
| *H02M 7/5387* | (2007.01) |
| *H03K 17/082* | (2006.01) |

(52) U.S. Cl.
CPC ..... *H03K 17/08128* (2013.01); *G01R 19/165* (2013.01); *H02H 3/085* (2013.01); *H02H 3/087* (2013.01); *H02M 1/08* (2013.01); *H02M 1/32* (2013.01); *H03K 17/063* (2013.01); *H03K 17/0812* (2013.01); *H03K 17/14* (2013.01); *H02M 7/5387* (2013.01); *H03K 17/0822* (2013.01)

(58) Field of Classification Search
CPC . H03K 17/08–0828; H03K 17/14–145; H02H 3/085; H02H 3/087; G01R 19/165; H02M 1/08; H02M 1/32
See application file for complete search history.

(56) References Cited

U.S. PATENT DOCUMENTS

2012/0242376 A1* 9/2012 Ose .................... H03K 17/0828
327/109

FOREIGN PATENT DOCUMENTS

JP    2015-019554 A    1/2015

* cited by examiner

*Primary Examiner* — Jared Fureman
*Assistant Examiner* — Christopher J Clark
(74) *Attorney, Agent, or Firm* — Oliff PLC

(57) ABSTRACT

In an overcurrent determining apparatus, a temperature obtainer obtains a temperature parameter indicative of a temperature of a switching element as a temperature measurement value. A determination voltage has a first voltage value when the temperature measurement value is a first temperature. A setter sets the determination voltage to a second voltage value upon determining that the temperature measurement value is a second temperature higher than the first temperature. The second voltage value is lower than the first voltage value and higher than a value of a Miller voltage of the switching element at the second temperature.

14 Claims, 12 Drawing Sheets

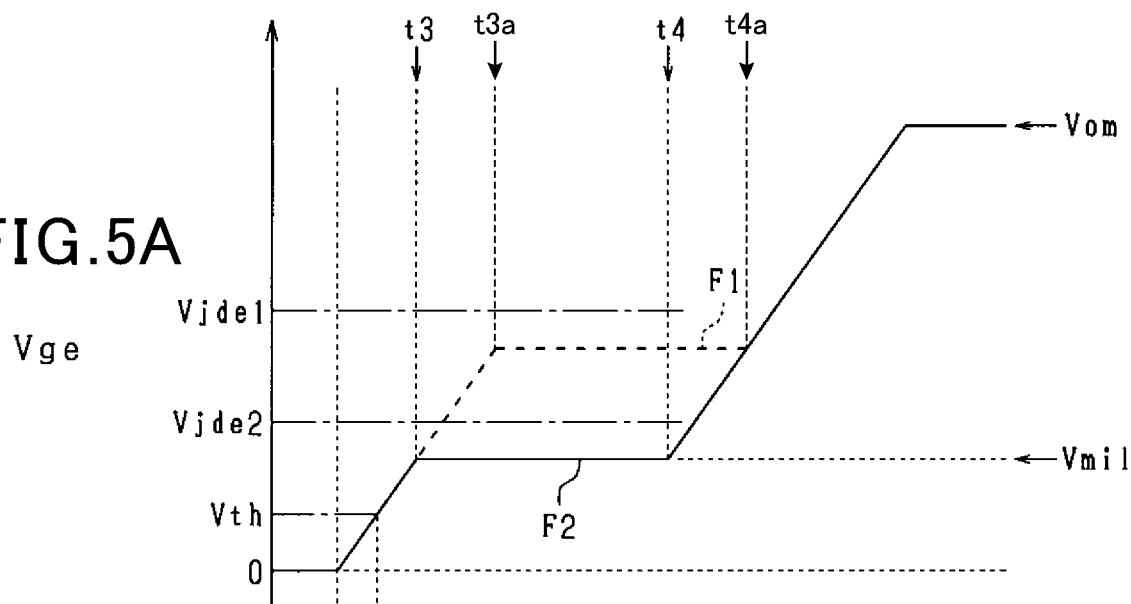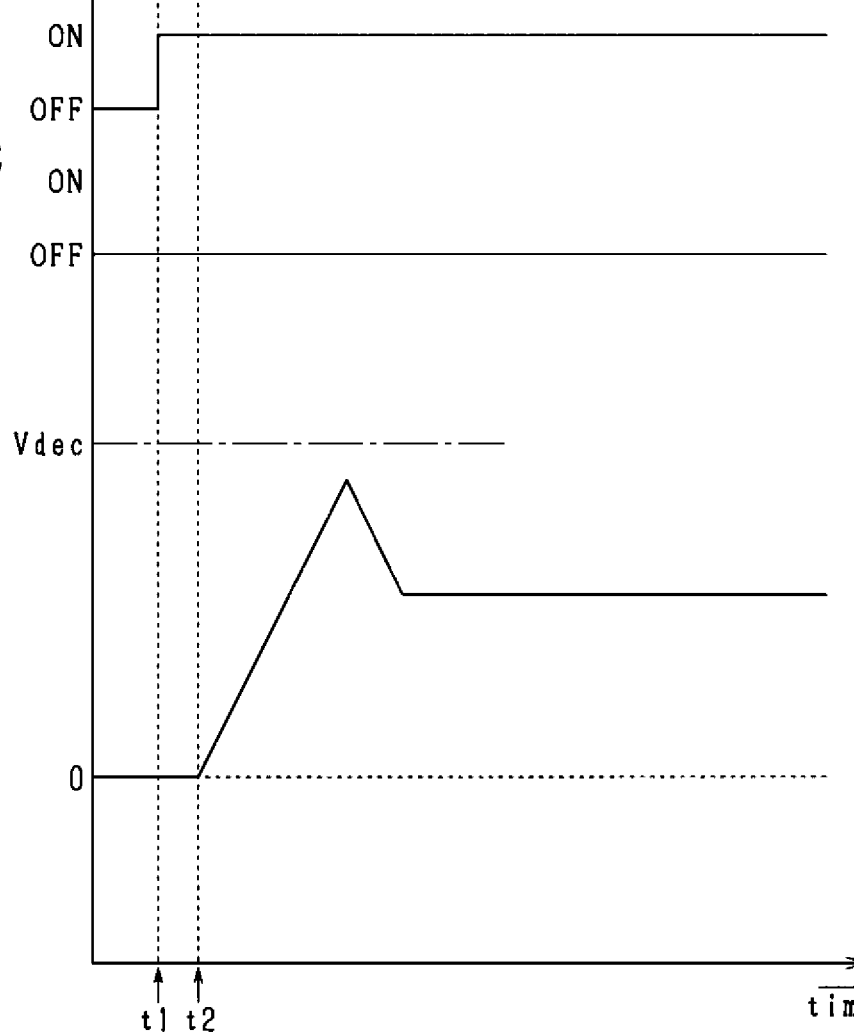

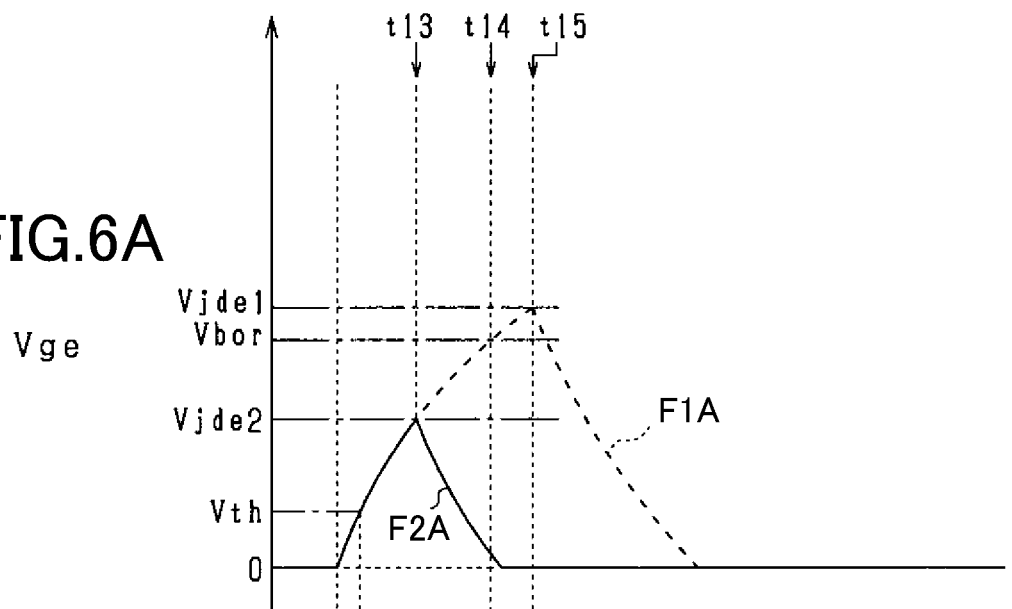
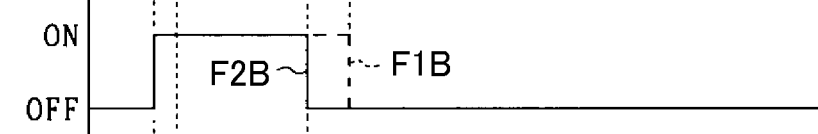
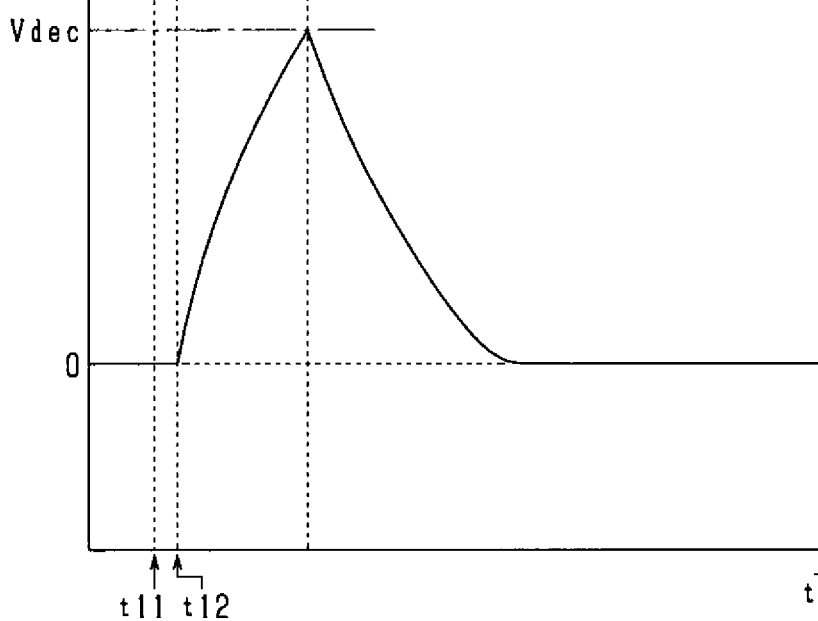

OVERCURRENT DETERMINING APPARATUS AND DRIVE UNIT USING THE SAME

CROSS REFERENCE TO RELATED APPLICATIONS

This application is based on and claims the benefit of priority from Japanese Patent Application 2017-214168 filed on Nov. 6, 2017, the disclosure of which is incorporated in its entirety herein by reference.

TECHNICAL FIELD

The present disclosure relates to overcurrent determining apparatuses for determining whether an overcurrent is flowing between a pair of main terminals of a switching element, and also relates to drive units using at least one of the overcurrent determining apparatuses.

BACKGROUND

For protecting a switching element, such as an IGBT, against an overcurrent, conventional overcurrent determining apparatuses are configured to (1) Determine whether a voltage at an open-close control terminal, i.e. an on-off control terminal, of the switching element has exceeded a predetermined determination voltage within a predetermined determination period (2) Determine that an overcurrent is flowing between the pair of main terminals of the switching element upon determining that the voltage at the open-close control terminal of the switching element has exceeded the predetermined determination voltage within the predetermined determination period An example of these conventional overcurrent determining apparatuses is disclosed in Japanese Patent Application Publication No. 2015-19554. The determination voltage is set to be higher than a predetermined Miller voltage of the switching element and to be lower than an upper limit of the voltage at the open-close control terminal. In addition, the determination period is set to be within a reference period for which, if no overcurrent flows between the pair of main terminals of the switching element, the voltage at the open-close terminal of the switching element has reached a determination voltage since it was closed.

SUMMARY

Users have an increasing demand for such an overcurrent determining apparatus to determine whether an overcurrent is flowing through a switching element much earlier. This is because the delay in the overcurrent determination may increase the integral of the overcurrent having flowed between the main terminals of the switching element until completion of the overcurrent determination.

In view of the circumstances set forth above, a first aspect of the present disclosure seeks to provide overcurrent determining apparatuses, each of which is capable of addressing the problem set forth above.

Specifically, a second aspect of the present disclosure aims to provide such overcurrent determining apparatuses, each of which is capable of determining whether an overcurrent is flowing through a switching element much earlier.

A third aspect of the present disclosure aims to provide drive units, each of which includes at least one of such overcurrent determining apparatuses according to the second aspect.

According to a first exemplary aspect of the present disclosure, there is provided an overcurrent determining apparatus applicable to a switching circuit. The switching circuit includes a switching element having first and second main terminals and an open-close control terminal, and a charging unit configured to supply electrical charge to the open-close control terminal of the switching element to thereby charge the open-close control terminal. The overcurrent deter mining apparatus is configured to execute an overcurrent determination routine to determine whether an overcurrent is flowing through the pair of first and second main terminals of the switching element based on whether a predetermined condition that a terminal voltage at the open-close control terminal of the switching element is higher than a determination voltage is satisfied. The overcurrent determining apparatus includes a temperature obtainer configured to obtain a temperature parameter indicative of a temperature of the switching element as a temperature measurement value. The determination voltage has a first voltage value when the temperature measurement value is a first temperature. The overcurrent determining apparatus includes a setter configured to set the determination voltage to a second voltage value upon determining that the temperature measurement value is a second temperature higher than the first temperature. The second voltage value is lower than the first voltage value and higher than a value of a Miller voltage of the switching element at the second temperature.

The overcurrent determining apparatus according to the first exemplary aspect is configured to set the determination voltage to the second voltage value upon determining that the temperature measurement value is the predetermined second temperature which is higher than the first temperature. The second voltage value is lower than the first voltage value and higher than the value of the Miller voltage of the switching element at the second temperature. This enables a determination period needed to determine whether an overcurrent is flowing through the switching element using the second voltage value at the second temperature to be shorter than a determination period needed to determine whether an overcurrent is flowing through the switching element using the first voltage value at the first temperature.

In contrast, if the determination voltage were set to a constant value independently of the temperature of the switching element, a value of the determination voltage might be set to be higher based on the value of the Miller voltage at the first temperature. This might result in the determination period being longer independently of the temperature measurement value of the switching element.

That is, because the above configuration of the overcurrent determining apparatus according to the first exemplary aspect makes shorter the determination period, making it possible to determine whether an overcurrent is flowing through the switching element earlier.

According to a second exemplary aspect of the present disclosure, there is provided an overcurrent determining apparatus applicable to a switching circuit. The switching circuit includes at least first and second switching elements parallely connected to each other. Each of the at least first and second switching elements has first and second main terminals and an open-close control terminal. The switching circuit includes a charging unit configured to supply electrical charge to the open-close control terminal of each of the at least first and second switching elements to thereby charge the open-close control terminal. The overcurrent determining apparatus is configured to execute an overcurrent determination routine to determine whether an overcurrent is flowing through the pair of first and second main terminals of each of the at least first and second switching elements based on whether a predetermined condition that a terminal voltage at the open-close control terminal of the corresponding one of the at least first and second switching elements is higher than a determination voltage is satisfied.

The overcurrent determining apparatus includes a temperature obtainer configured to obtain at least first and second temperature parameters respectively indicative of temperatures of the at least first and second switching elements. The at least first and second temperature parameters are respectively referred to as at least first and second temperature measurement values.

The overcurrent determining apparatus includes a setter having correlation data indicative of the relationship between the determination voltage and each of the at least first and second temperature measurement values such that, the higher each of the at least first and second temperature measurement values is, the lower the determination voltage is.

The setter is configured to commonly set a value of the determination voltage for each of the at least first and second switching elements to a selected value on the correlation data, the selected value corresponding to the lowest value in the at least first and second temperature measurement values.

The overcurrent determining apparatus according to the second exemplary aspect includes the setter having the correlation data indicative of the relationship between the determination voltage and each of the at least first and second temperature measurement values such that, the higher each of the at least first and second temperature measurement values is, the lower the determination voltage is.

The setter is configured to commonly set a value of the determination voltage for each of the at least first and second switching elements to a selected value on the correlation data, the selected value corresponding to the lowest value in the at least first and second temperature measurement values.

This configuration enables the determination period for each of the at least first and second switching elements to be shorter, making it possible to determine whether an overcurrent is flowing through at least one of the at least first and second switching elements earlier.

In particular, the overcurrent determining apparatus according to the second exemplary aspect is configured such that a value of the determination voltage is set to be a highest value corresponding to the lowest value in the at least first and second temperature measurement values. If a value of the determination voltage were set to be a lower voltage value corresponding to a temperature measurement value except for the lowest value in the at least first and second temperature measurement values, the value of the determination voltage might be lower than the value of the Miller voltage of a selected one of the at least first and second switching elements corresponding to the lowest value. This therefore might result in the overcurrent determining apparatus erroneously determining that an overcurrent is flowing through the selected one of the at least first and second switching elements although there is no actual overcurrent flowing through the selected one of the at least first and second switching elements.

In contrast, the above configuration of the overcurrent determining apparatus according to the second exemplary aspect enables a value of the determination voltage for each of the at least first and second switching elements to be set to the selected value corresponding to the lowest value in the at least first and second temperature measurement values. This configuration therefore prevents the overcurrent determining apparatus from erroneously determining that an overcurrent is flowing through the selected one of the at least first and second switching elements.

According to a third exemplary aspect of the present disclosure, there is provided a drive unit including a switching circuit. The switching circuit includes a switching element having first and second main terminals and an open-close control terminal, and a charging unit configured to supply electrical charge to the open-close control terminal of the switching element to thereby charge the open-close control terminal. The drive unit includes a drive controller configured to (1) Execute an overcurrent determination routine to determine whether an overcurrent is flowing through the pair of first and second main terminals of the switching element based on whether a predetermined condition that a terminal voltage at the open-close control terminal of the switching element is higher than a determination voltage is satisfied (2) Obtain a temperature parameter indicative of a temperature of the switching element as a temperature measurement value, the determination voltage having a first voltage value when the temperature measurement value is a first temperature (3) Set the determination voltage to a second voltage value upon determining that the temperature measurement value is a second temperature higher than the first temperature, the second voltage value being lower than the first voltage value and higher than a value of a Miller voltage of the switching element at the second temperature.

The drive unit according to the third exemplary aspect obtains the same benefit obtained by the overcurrent determining apparatus according to the first exemplary aspect.

BRIEF DESCRIPTION OF THE DRAWINGS

Other aspects of the present disclosure will become apparent from the following description of embodiments with reference to the accompanying drawings in which:

FIGS. 5A to 5D are a joint timing chart schematically illustrating an example of the overcurrent determination routine executed by the drive controller if no overcurrent is flowing through a target switching element in a normal condition;

FIGS. 6A to 6D are a joint timing chart schematically illustrating an example of the overcurrent determination routine executed by the drive controller if an overcurrent is flowing through the target switching element in an abnormal condition;

DETAILED DESCRIPTION OF EMBODIMENT

Figure 1:
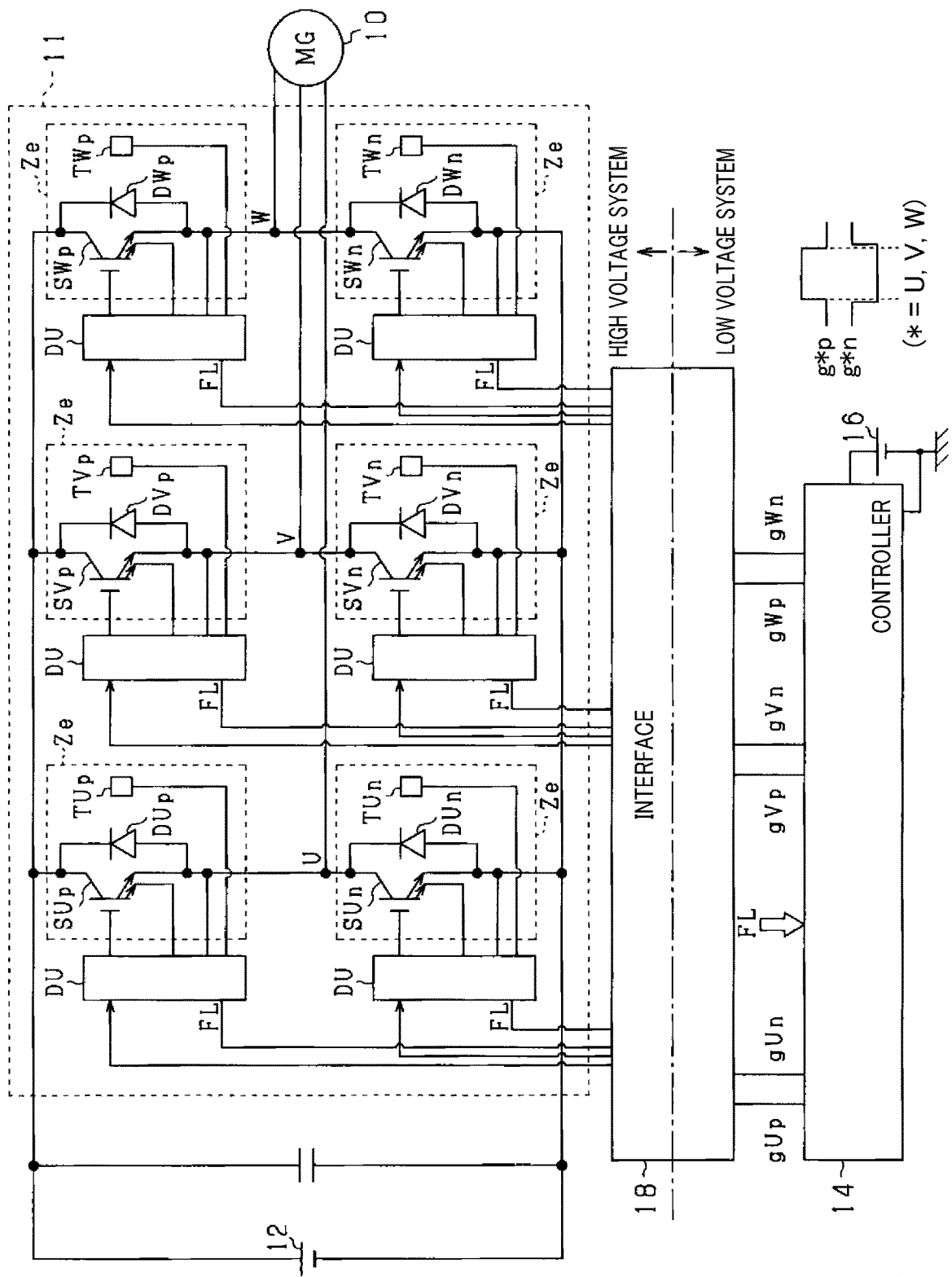
FIG. 1 is a circuit diagram schematically illustrating an overall configuration of a control system for a motor-generator according to the first embodiment of the present disclosure.

The following describes embodiments of the present disclosure with reference to the accompanying drawings. In the embodiments, like parts between the embodiments, to which like reference characters are assigned, are omitted or simplified in description to avoid redundant description.

First Embodiment

Referring to FIG. 1, there is illustrated a three-phase motor-generator as an example of rotating machines, referred to simply as a "motor-generator" 10, installed in, for example, a hybrid vehicle or an electrical vehicle as its main engine according to the first embodiment. The motor-generator 10 is mechanically coupled to driving wheels (not shown) of the hybrid vehicle or the electrical vehicle.

For example, as the motor-generator 10, a brushless DC motor, i.e. a three-phase permanent magnet SM (Synchronous Motor), is used.

The motor-generator 10 is comprised of, for example, a rotor including a magnetic field and a stator including three-phase windings, i.e. U-, V-, and W-phase windings. The rotor of the motor-generator 10, which includes permanent magnets, is rotated based on magnetic interaction between the magnetic field of the permanent magnets of the rotor and a rotating field generated by the three-phase windings when the three-phase windings are energized. For example, the three-phase windings (U-, V-, and W-phase windings) each have a first end connected to a common junction (neutral point) in, for example, a star-configuration.

In FIG. 1, there is also illustrated a control system 100 for controlling the motor-generator 10. The control system 100 is equipped with an inverter 11, a high-voltage battery 12, drive units, i.e. drivers, DU, a controller 14, a low-voltage battery 16, and an interface 18.

To the motor-generator 10, the high-voltage battery 12 is electrically connected via the inverter 11. The high-voltage battery 12 has a terminal voltage, which is equal to or higher than 100 V, thereacross. A lithium-ion storage battery or a nickel-hydrogen storage battery can be used as the high-voltage battery 12.

The inverter 11 is designed as a three-phase inverter. The inverter 11 includes three pairs of series-connected high- and low-side (upper- and lower-arm) switching elements SUp and Sun, SVp and SVn, and SWp and SWn. The inverter 11 also includes flywheel diodes DUp and DUn, DVp and DVn, and DWp and DWn electrically connected in antiparallel to the corresponding switching elements SUp and SUn, SVp and SVn, and SWp and SWn, respectively.

In the first embodiment, as each switching element $S^*\#$ ($*=U, V, W, \#=p, n$), a voltage-controlled semiconductor switching element, such as an IGBT, is used.

When power MOSFETs are used as the switching elements $S^*\#$ ($*=U, V, W, \#=p, n$), intrinsic diodes of the power MOSFETs can be used as the flywheel diodes, thus eliminating the flywheel diodes.

Each of the switching elements $S^*\#$ has a pair of an output terminal, i.e. the emitter of the IGBT, and an input terminal, i.e. the collector of the IGBT, which corresponds to a pair of main terminals of the corresponding switching element. In particular, the collector of each switching element (IGBT) corresponds to a first main terminal in the pair of main terminals thereof, and the emitter of each switching element (IGBT) corresponds to a second main terminal in the pair of main terminals thereof.

Adjusting a voltage at the open-close control terminal of each switching element $S^*\#$, such as the gate of each IGBT, to be higher than a predetermined threshold voltage Vth for the corresponding switching element $S^*\#$ enables the corresponding switching element $S^*\#$ to be switched from an off state (open state) to an on state (closed state). The voltage at the open-close control terminal of each switching element $S^*\#$, such as the gate of each IGBT, will be referred to as a gate voltage Vge. The threshold voltage Vth for each switching element $S^*\#$ represents a value of the gate voltage Vge at which the corresponding switching element $S^*\#$ is switched from the off state to the on state. In detail, the threshold voltage Vth for the gate voltage Vge of each switching element appears when a reference current having a reference level of, for example, 1 mA is flowing through the corresponding switching element.

The three pairs of switching elements are parallelly connected to each other in bridge configuration. A connecting point through which each of the switching elements $S^*p$ is connected to a corresponding one of the elements $S^*n$ in series is connected to a busbar extending from the second terminal of a corresponding one of the U-phase winding, V-phase winding, and W-phase winding. A first end of the series-connected switching elements of each of the three pairs, such as the collector of the corresponding high-side switching element, is connected to the positive terminal of the high-voltage battery 12 via a positive DC line. The opposite second end of the series-connected switching elements of each of the three pairs, such as the emitter of the corresponding low-side switching element, is connected to the negative terminal of the high-voltage battery 12 via a negative DC line.

The inverter 11 also includes temperature-sensitive sensors TUp and TUn, TVp and TVn, and TWp and TWn located to be close to the corresponding switching elements SUp and SUn, SVp and SVn, and SWp and SWn, respectively. Each temperature-sensitive sensor $T^*\#$ is configured to measure a temperature of the corresponding switching element $S^*\#$. That is, each semiconductor switch Ze is comprised of the corresponding switching element $S^*\#$, the corresponding flywheel diode $D^*\#$, and the corresponding temperature-sensitive sensor $T^*\#$ packaged therein. A temperature-sensitive diode or a thermistor can be used as each temperature-sensitive sensor T*#.

For example, the controller 14 is mainly comprised of a microprocessor and a non-transitory computer readable storage medium. The controller 14 operates on a power-supply voltage, lower than the terminal voltage across the high-voltage battery 12, supplied from the low-voltage battery 16. Thus, the controller 14 and the low-voltage battery 16 constitute a low voltage system. In contrast, the motor-generator 10, the inverter 11, and the high-voltage battery 12 constitute a high voltage system.

The controller 14 is designed to individually drive the switching elements SUp, SUn, SVp, SVn, SWp, and SWn of the inverter 11 to thereby adjust a controlled variable of the motor-generator 10, such as an output torque of the motor-generator 10, to a commanded value.

Specifically, the controller 14 is designed to individually generate and send drive signals gUp, gUn, gVp, gVn, gWp, and gWn to the drive units DU provided for the respective switching elements SUp, SUn, SVp, SVn, SWp, and SWn. This causes the respective drive units DU to individually turn on or off the respective switching elements SUp, SUn, SVp, SVn, SWp, and SWn. The individual turn-on or off of the respective switching elements SUp, SUn, SVp, SVn, SWp, and SWn convert the output DC voltage across the capacitor C into an AC voltage, and supply the AC voltage to the motor-generator 10.

Each of the drive signals g*# has a predetermined duty cycle, i.e. a predetermined ratio of on duration to the total duration of each switching cycle for a corresponding one of the switching elements S*# (see FIG. 1).

Specifically, the controller 14 is designed to complementarily turn on the high- and low-side switching elements S*# for each leg (phase) via the corresponding drive units DU according to the corresponding drive signals g*#. In other words, the controller 14 is designed to alternately turn on the high-side switching element S*p of one leg (phase) and the low-side switching element S*n of the same leg (phase). This drive alternately closes the conductive path between the collector and emitter of the high-side switching element S*p of one leg and the conductive path between the collector and emitter of the low-side switching element S*n of the same leg.

The interface 18 is capable of electrically isolating the high voltage system and the low voltage system. Specifically, the interface 18 includes insulation members, such as photocouplers, provided for the respective switching elements S*# of the inverter 11. Each of the photocouplers is comprised of a photodiode and a phototransistor. The photocouplers are configured to enable communications between the high and low voltage systems while establishing electrical isolation therebetween. Specifically, each of the photocouplers is configured to enable the controller 14 to control a corresponding one of the switching elements S*# while establishing electrical isolation between the controller 14 and a corresponding one of the switching elements S*#.

Figure 2:
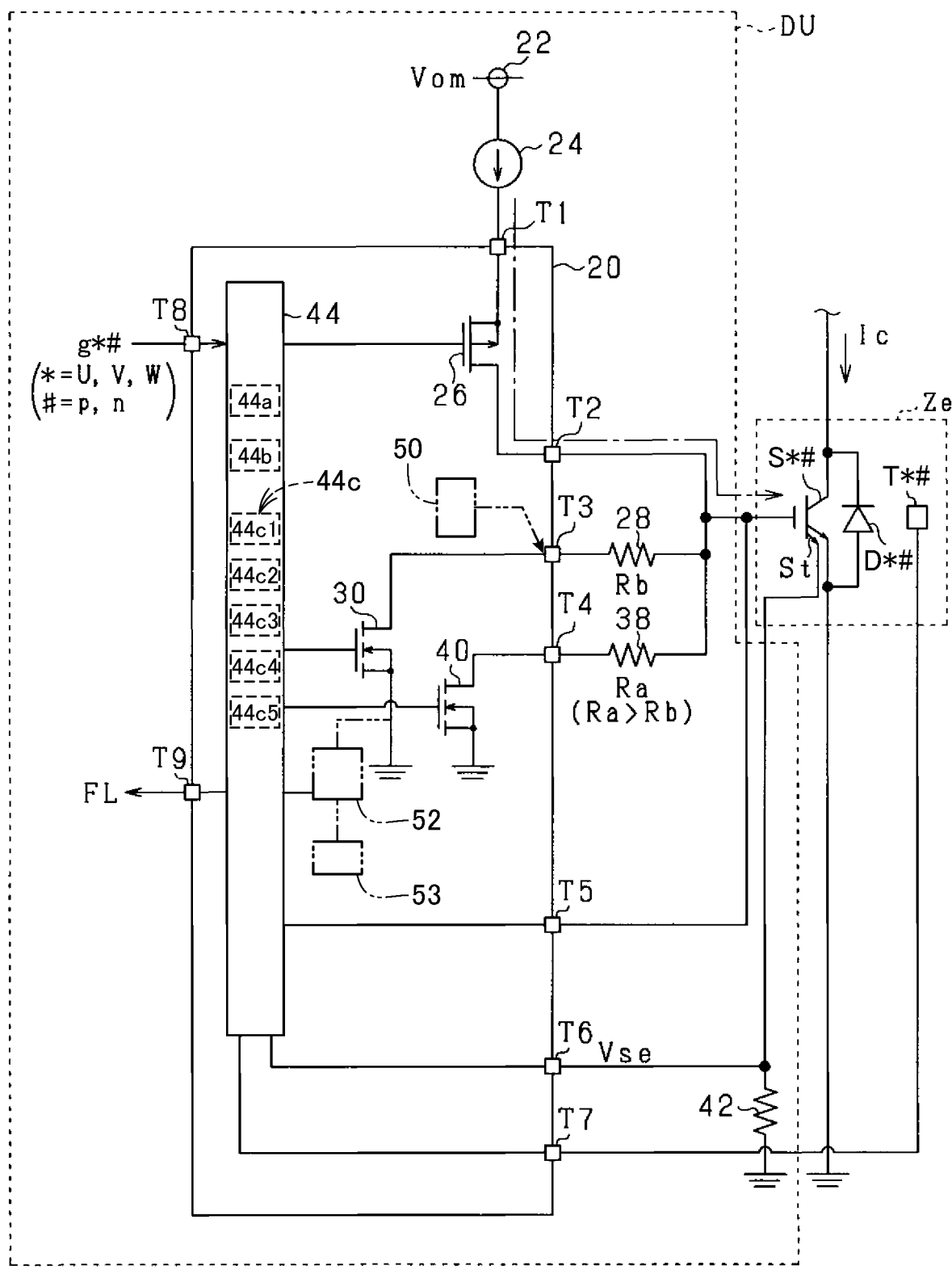
FIG. 2 is a circuit diagram schematically illustrating an example of the structure of each drive unit of the control system illustrated in FIG. 1.

Next, the following describes an example of the structure of each drive unit DU provided for a corresponding one switching element S*# with reference to FIG. 2.

Referring to FIG. 2, the drive unit DU is comprised of a drive IC 20, which is, for example, configured as a single chip semiconductor IC, a constant voltage power source 22, a constant current power source 24, a discharging resistor 28, a soft turnoff resistor 38, and a sense resistor 42.

The drive IC 20 has first to ninth terminals T1 to T9, and the constant current power source 24 is connected to the first terminal T1, and also connected to the constant voltage power source 22. The constant voltage power source 22 has a predetermined constant output voltage Vom of, for example, 15 V, and the constant current power source 24 is operative to supply, based on the constant output voltage Vom, a constant current to the drive IC 20 via the terminal T1.

The drive IC 20 includes a charging switching element (SW) 26, a discharging switching element (SW) 30, a soft turnoff switching element (SW) 40, and a drive controller 44. As the charging switching element 26, a P-channel MOSFET is used. In contrast, as each of the discharging switching element 28 and the soft-turnoff switching element 38, an N-channel MOSFET is used.

The constant current power source 24 is connected to the drain of the charging switching element 26 via the first terminal T1, and the source of the charging switching element 26 is connected to the gate of the switching element S*# via the second terminal T2. The constant current power source 24 and the charging switching element 26 according to the first embodiment serve as, for example, a charging unit.

The gate of the switching element S*# is connected to the emitter thereof via the discharging resistor 28, the third terminal T3, the discharging switching element 30, and a common signal ground. The discharging switching element 28 has a predetermined resistance Rb.

The gate of the switching element S*# is connected to the emitter thereof via the soft turnoff resistor 38, the fourth terminal T4, the soft turnoff switching element 40, and the common signal ground. The soft turnoff switching resistor 38 has a predetermined resistance Ra; the resistance Ra is set to be higher than the resistance Rb. The soft turnoff resistor 38 and the soft turnoff switching element 40 serve as, for example, a soft turnoff unit.

Each switching element S*# has a sense terminal St for outputting a minute current, i.e. a sense current, associated with a current, i.e. a collector current Ic, flowing through the conductive path between the input terminal and the output terminal thereof, i.e. between the collector and the emitter thereof. For example, the magnitude of the minute current is 0.01%, i.e. one ten-thousandth of the collector current Ic.

The sense terminal St is connected to a first end of the sense resistor 42, and a second end, opposing the first end, of the sense resistor 42 is connected to the emitter of the switching element S*# via the common signal ground.

When the collector current Ic flows through the conductive path of each switching element S*#, the sense current correlating with the collector current Ic flows through the sense resistor 42, so that a voltage drop across the sense resistor 42 occurs. Thus, it is possible to obtain the voltage drop across the sense resistor 42 as a sense voltage Vse at the first end of the sense resistor 42 connected to the sense terminal St. The sense voltage Vse is an inter-terminal current parameter correlating with an electric state quantity of the magnitude of the collector current Ic flowing through the switching element S*#. That is, the level of the sense voltage Vse serves as a function of, i.e. correlates with, the magnitude of the collector current Ic flowing through the switching element S*#.

In the first embodiment, the positive polarity of the sense voltage Vse according to the first embodiment is defined when the potential at the first end of the resistor 42 connected to the sense terminal St is higher than the potential at the emitter of the switching element S*#. The potential at the emitter of the switching element S*# is set to zero, because the emitter of the switching element S*# is connected to the common signal ground.

The gate of the switching element S*# is connected to the drive controller 44 via the fifth terminal T5, so that the gate voltage Vge of the switching element S*# is input to the drive controller 44 via the fifth terminal T5. The first end of the resistor 42 is connected to the drive controller 44 via the sixth terminal T6, so that the sense voltage Vse is input to the drive controller 44 via the sixth terminal T6. The temperature, referred to as Tmp, of the switching element S*# measured by the temperature-sensitive sensor T*# is input to the drive controller 44 via the seventh terminal T7.

In addition, the drive controller 44 is connected to the controller 14 via the eighth terminal T8 and the interface 18, and is also connected to the controller 14 via the ninth terminal T9 and the interface 18.

The drive controller 44 is operative to receive the drive signal g*# input thereto from the controller 14 via the interface 18 and the terminal T8. The drive signal g*# has one of a predetermined first logical level, i.e. a high level, defined as an on command, and a predetermined second logical level, i.e. a low level, defied as an off command.

The drive controller 44 is operative to alternately perform, based on the drive signal g*#, (1) The charging task for the switching element S*# by means of switching operations of the charging and discharging switching elements 26 and 30

(2) The discharging task for the switching element S*# by means of switching operations of the charging and discharging switching elements 26 and 30

The alternative charging and discharging tasks enable the switching element S*# to be driven.

Specifically, the drive controller 44 functionally includes a charging unit 44a and a discharging unit 44b.

The charging unit 44a of the drive controller 44 turns on, i.e. closes, the charging switching element 26 and turns off, i.e. opens, the discharging switching element upon the drive signal g*# being changed from the off command to the on command. This enables a constant current generated by the constant current power source 24 to be supplied to the gate of the switching element S*#, thus supplying electrical charge to the gate of the switching element S*#. This enables the gate of the switching element S*"' to be charged, so that the switching element S*# is turned on when the gate voltage Vge has reached the threshold voltage Vth.

The discharging unit 44b of the drive controller 44 turns on the discharging switching element 30 and turns off the charging switching element 26 upon the drive signal g*# being changed from the on command to the off command. This enables the gate of the switching element S*# to be discharged through the discharging switching element 30 via a normal gate discharging path defined between the gate and source of the switching element S*# via the discharging resistor 28, the discharging switching element 30, and the common signal line. This changes the switching element S*# from the on state to the off state when the gate voltage Vge becomes lower than the threshold voltage Vth.

In addition, the drive controller 44 functionally includes an overcurrent determination unit 44c that performs an overcurrent determination routine for a corresponding switching element S*# every predetermined period during an overcurrent determination period. The overcurrent determination period is defined between a first timing and a second timing.

The first timing is defined at any timing within a period from the charging start timing of the charging unit 44a to the timing when the gate voltage Vge has reached a gate determination voltage Vjde described later assuming that an overcurrent flows through the switching element S*#. For example, the first timing according to the first embodiment is set to the start timing of the charging task.

The second timing is defined at any timing within a period from a predetermined timing after the charging start timing to a timing before the timing when the gate voltage Vge has reached the gate determination voltage Vjde assuming that no overcurrent flows through the switching element S*#. For example, the second timing is set to an end timing of a miller period of the switching element S*# assuming that no overcurrent flows through the switching element S*#. Note that the Miller period represents a period during which the gate voltage Vge remains at a predetermined constant voltage, i.e. a Miller voltage Vmil, while the drain voltage rises or falls during the charging task or discharging task of the switching element S*#.

Upon starting the overcurrent determination routine for each switching element S*#, the drive controller 44, i.e. the overcurrent determination unit 44c, obtains a temperature parameter indicative of the temperature Tmp of the switching element S*#, such as the temperature Tmp of the switching element S*# itself, from the temperature-sensitive sensor T*# in step S10. Note that the temperature Tmp according to the first embodiment corresponds to, for example, a temperature measurement value according to the first embodiment, and the operation in step S10 corresponds to, for example, a temperature obtainer 44c1.

Next, the drive controller 44 sets a value of the gate determination voltage Vjde to be higher than the Miller voltage Vmil of the switching element S*# and to be lower than the output voltage Vom of the constant voltage power source 22 in step S12. The reason why the gate determination voltage Vjde is set to be higher than the Miller voltage Vmil is that it is to avoid an erroneous determination that an overcurrent is flowing through the switching element S*# under execution of the charging task although no overcurrent is flowing through the switching element S*#.

Figure 4:
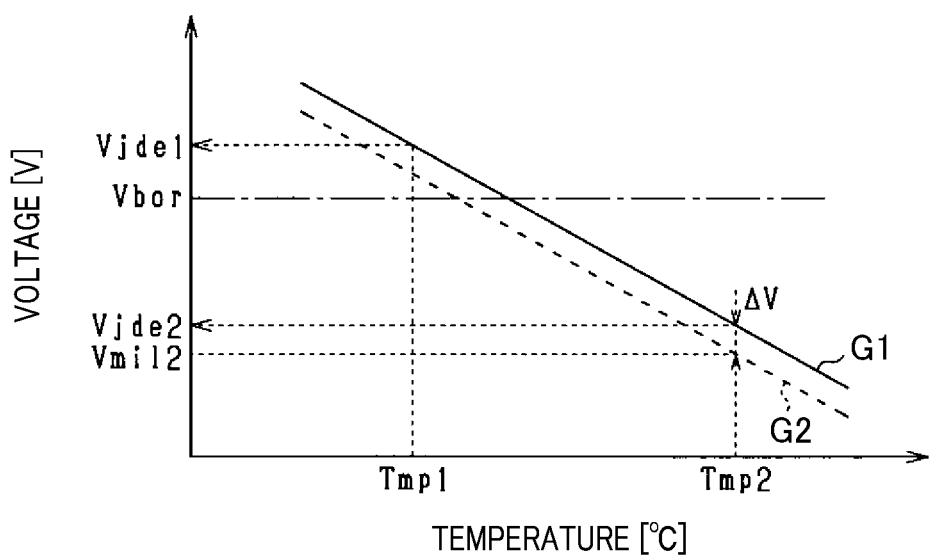
FIG. 4 is a graph schematically illustrating (1) An example of the relationships between the temperature of a switching element and a gate determination voltage (2) An example of the relationships between the temperature of the switching element and a Miller voltage according to the first embodiment.

The inventors of this application have considered the characteristics of the switching element S*#, and, as a result of this consideration, the inventors have found that, as illustrated in FIG. 4, the Miller voltage Vlim has a negative correlation with the temperature Tmp, that is, the higher the temperature Tmp is, the lower the Miller voltage Vlim is.

FIG. 4 schematically illustrates (1) Correlation data G1 indicative of an example of the relationships between the temperature of the switching element S*# and the gate determination voltage Vjde, which is stored in, for example, the drive controller 44

(2) Correlation data G2 indicative of an example of the relationships between the temperature of the switching element S*# and the Miller voltage Vmil, which is stored in, for example, the drive controller 44

FIG. 4 schematically illustrates, by a solid line based on the correlation data G1, how the gate determination voltage Vjde is changed depending on the temperature Tmp of the switching element S*#, and also illustrates, by a dashed line based on the correlation data G2, how the Miller voltage Vlim is changed depending on the temperature Tmp of the switching element S*#.

In accordance with the inventor's finding, the gate determination voltage Vjde according to the first embodiment is set to be higher by a predetermined voltage difference ΔV than the Miller voltage Vlim within a predetermined operating temperature range of the switching element S*#. That is, the gate determination voltage Vjde is set to be continuously lower as the temperature Tmp of the switching element S*# becomes higher.

That is, FIG. 4 also schematically illustrates, by the solid line based on the correlation data G1, how the gate determination voltage Vjde is changed depending on the Miller voltage Vlim.

Note that the magnitude of the voltage difference ΔV is for example set to be slightly larger than the maximum amplitude of a noise voltage that is assumed to be added to the gate voltage Vge. The voltage difference ΔV is set to be constant independently of the temperature Tmp of the switching element S*# or set to vary depending on the temperature Tmp of the switching element S*#.

Specifically, FIG. 4 illustrates that the gate determination voltage Vjde has a first voltage value Vjde1 when the temperature Tmp of the switching element S*# is at a first temperature Tmp1. In addition, FIG. 4 also illustrates that the gate determination voltage Vjde has a second voltage value Vjde2 lower than the first voltage value Vjde1 when the temperature Tmp of the switching element S*# is at a second temperature Tmp2 which is higher than the first temperature Tmp1.

For example, in step S12, the drive controller 44 sets the gate determination voltage Vjde in accordance with the correlation data G1 indicative of an example of the relationships between the temperature of the switching element S*# and the gate determination voltage Vjde illustrated in FIG. 4 stored therein.

Specifically, in step S12, the drive controller 44 sets the gate determination voltage Vjde to the second voltage value Vde2 upon the temperature Tmp of the switching element S*# is the second temperature Tmp2 higher than the first temperature Tmp1. The second voltage value Vde2 is lower than the first voltage value Vjde1 and higher than a value Vmil2 of the Miller voltage Vmil at the second temperature Tmp2. Note that the operation in step S12 serves as, for example, a setter 44c2.

In step S14, the drive controller 44 obtains the gate voltage Vge of the switching element S*#. The gate voltage Vge according to the first embodiment corresponds to, for example, a terminal voltage at an open-close control terminal of a switching element. The operation in step S14 corresponds to, for example, a voltage obtainer 44c3.

In step S16, the drive controller 44 determines whether the gate voltage Vge is higher than the gate determination voltage Vjde.

Upon determining that the gate voltage Vge is higher than the gate determination voltage Vjde (YES in step S16), the drive controller 44 obtains the sense voltage Vse in step S18. The sense voltage Vse according to the first embodiment corresponds to, for example, an inter-terminal current parameter, and the operation in step S18 corresponds to, for example, a current parameter obtainer 44c4.

Following the operation in step S18, the drive controller 44 determines whether the sense voltage Vse is higher than a predetermined sense determination voltage Vdec in step S20. The sense determination voltage Vdec corresponds to an upper limit of the collector current Ic; the reliability of the switching element S*# can be maintained until the collector current Ic is kept to be equal to or lower than its upper limit. A value of the sense determination voltage Vdec is previously determined for each switching element S*#. Note that the sense determination voltage Vdec corresponds to, for example a determination current parameter.

Upon determining that the sense voltage Vse is higher than the predetermined sense determination voltage Vdec (YES in step S20), that is, upon determining that the gate voltage Vge is higher than the gate determination voltage Vjde and the sense voltage Vse is higher than the sense determination voltage Vdec, the drive controller 44 determines that an overcurrent is flowing through the switching element S*# in step S22.

Note that a condition of whether the gate voltage Vge is higher than the gate determination voltage Vjde corresponds to, for example, a first condition. In addition, a condition of whether the sense voltage Vse is higher than the sense determination voltage Vdec corresponds to, for example, a second condition. The operations in steps S16, S20, and S22 correspond to, for example, a determiner 44c5.

The gate determination voltage Vjde serves as, for example, a current-related determination value.

Following the affirmative determination in step S22, the drive controller 44 performs an overcurrent protection task that (1) Turns off or holds off both the charging switching element 26 and discharging switching element 30

(2) Turns on the soft turnoff switching element 40 in step S24

This enables the electrical charge stored in the gate of the switching element S*# to be discharged through a gate discharging path defined from the gate of the switching element S*#, the soft turnoff resistor 38, the soft turnoff switching element 40, the common signal ground, and the emitter of the switching element S*#.

The overcurrent protection task discharges the electrical charge stored in the switching element S*# via the gate discharging path, thus forcibly turning off the switching element S*# slower than turnoff of the switching element S*# through the discharging switching element 28 and discharging resistor 30. This is because the resistance Ra of the soft turnoff resistor 38 is higher than the resistance Rb of the discharging resistor 30.

If the switching speed of the switching element S*# from the on state to the off state were high while an overcurrent is flowing through the switching element S*# as the corrector current Ic, there might be an excessively high surge voltage produced due to the high-speed shutdown of the switching element S*#. Thus, in this situation, the overcurrent protection task forcibly changes the resistance of the gate discharging path of the gate of the switching element S*# via the soft turnoff resistor 38 to be higher than that of the normal gate discharging path of the gate of the switching element S*# via the discharging resistor 28 in normal situations. This protects the switching element S*# against a surge produced due to the turn-off of the switching element S*#.

When executing the overcurrent protection task, the drive controller 44 executes a task to output a fail-safe signal FL to the controller 14 via the ninth terminal T9 and the interface 18 in step S26. The fail-safe signal FL represents an abnormal state in the operation of the switching element S*#. In response to the fail-safe signal FL, the controller 14 shuts down the inverter 11.

Otherwise, upon determining that the gate voltage Vge is equal to or lower than the gate determination voltage Vjde (NO in step S14) or that the sense voltage Vse is equal to or lower than the predetermined sense determination voltage Vdec (NO in step S20), the drive controller 44 determines that no overcurrent is flowing through the switching element S*# in step S28, terminating the overcurrent determination routine.

Note that the drive controller 44 can be comprised of, for example, a processor and a processor-readable memory, such as a processor-readable nonvolatile memory storing program instructions. That is, the processor can run the program instructions to thereby execute the operations in steps S1 to S14, in other words, to thereby implement at least the modules 44c1 to 44c5. As another example, the drive controller 44 can be comprised of hardwired logic circuits that can implement the operations in step S1 to S14, that is, that can respectively serve as at least the modules 44c1 to 44c5. As a further example, the drive controller 44 can be comprised of hardwired/programmed hybrid logic circuits that can implement the operations in step S1 to S14, that is, that can respectively serve as at least the modules 44c1 to 44c5.

Next, the following describes how an example of the overcurrent protection task is performed if no overcurrent is flowing through a target switching element S*# in a normal condition with reference to FIGS. 5A to 5D first. In addition, the following describes how the example of the overcurrent protection task is performed if an overcurrent is flowing through the target switching element S*# due to, for example, the occurrence an upper-lower arm short-circuit in the target switching element in an abnormal condition with reference to FIGS. 6A to 6D next.

FIGS. 5A to 5E are a joint timing chart schematically illustrating the example of the overcurrent protection task in the normal condition.

Specifically, FIG. 5A schematically illustrates an example of how the gate voltage Vge of the target switching element S*# is changed over time, and FIG. 5B schematically illustrates an example of how the charging switching element 26 is driven over time. FIG. 5C schematically illustrates an example of how the soft-turnoff switching element 40 is driven over time, and FIG. 5D schematically illustrates an example of how the sense voltage Vse is changed over time.

In particular, in FIG. 5A, a dashed graph F1 represents how the gate voltage Vge is changed over time upon the temperature Tmp of the target switching element S*# being the first temperature Tmp1. In contrast, a solid graph F2 represents how the gate voltage Vge is changed over time upon the temperature Tmp of the target switching element S*# being the second temperature Tmp2.

The following describes the example of the overcurrent protection task in the normal condition using the solid graph F2.

Referring to FIG. 5, when the charging task is started at time t1, the discharging switching element 30 is turned off, and the charging switching element 26 is turned on. This causes a constant current generated by the constant current power source 24 to be supplied to the gate of the switching element S*#, so that the gate voltage Vge starts increasing.

Thereafter, when the gate voltage Vge reaches the threshold voltage Vth at time t2, the sense voltage Vse starts increasing.

After the start of an increase of the sense voltage Vse, the gate voltage Vge reaches the Miller voltage Vmil at time t3. At that time, the gate voltage Vge remains at the Miller voltage Vmil until the Miller period has elapsed since the time t3, because no overcurrent is flowing through the target switching element S*#. For this reason, while the Miller period has elapsed since the time t3, the gate voltage Vge is substantially maintained at the Miller voltage Vmil, so that the gate voltage Vge is kept to be equal to or lower than the second voltage value Vjde2. This prevents the sense voltage Vse from exceeding the sense determination voltage Vdec. After the time t4, the gate voltage Vge has reached the output voltage Vom of the constant voltage power source 22.

Note that, although a Miller voltage arrival timing t3a of the graph F1 is different from the Miller voltage arrival timing t3, and a Millar period end timing t4a of the graph F1 is different from the Miller period end timing t4, the whole behavior of the graph F1 is substantially similar to the whole behavior of the graph F2. So, the redundant descriptions of the graph F1 are omitted.

Next, the following describes the example of the overcurrent protection task in the abnormal condition.

FIGS. 6A to 6E respectively correspond to FIGS. 5A to 5E.

In particular, in FIG. 6A, a dashed graph F1A represents how the gate voltage Vge is changed over time upon the temperature Tmp of the target switching element S*# being the first temperature Tmp1. In contrast, a solid graph F2A represents how the gate voltage Vge is changed over time upon the temperature Tmp of the target switching element S*# being the second temperature Tmp2.

In addition, in FIG. 6B, a dashed graph F1B represents how the charging switching element 26 is driven over time upon the temperature Tmp of the target switching element S*# being the first temperature Tmp1. In contrast, a solid graph F2B represents how the charging switching element 26 is driven over time upon the temperature Tmp of the target switching element S*# being the second temperature Tmp2.

Referring to FIG. 6, when the charging task is started at time t11, the discharging switching element 30 is turned off, and the charging switching element 26 is turned on. This causes a constant current generated by the constant current power source 24 to be supplied to the gate of the target switching element S*#, so that the gate voltage Vge starts increasing.

Thereafter, when the gate voltage Vge reaches the threshold voltage Vth at time t12, the sense voltage Vse starts increasing.

After the start of an increase of the sense voltage Vse, because there is no Miller period in the gate voltage Vge while an overcurrent is flowing through the target switching element S*#, the gate voltage Vge continuously increases after the time t11 without remaining at the Miller voltage Vmil.

This results in (1) The gate voltage Vge reaching the second voltage value Vjde2 at time t13 upon the temperature Tmp of the switching element S*# being the second temperature Tmp2 (see the graph F1A)

(2) The gate voltage Vge reaching the first voltage value Vjde1 at time t15 upon the temperature Tmp of the switching element S*# being the first temperature Tmp1 (see the graph F2A)

On the other hand, the sense voltage Vse, which has increased since the time t12, continuously increases to reach the sense determination voltage Vdec at time t14 while the overcurrent is flowing through the target switching element S*#.

The drive controller 44 stores beforehand a border voltage Vbor. The border voltage Vbor is a voltage value at which the gate voltage Vge arrives when the sense voltage Vse reaches the sense determination voltage Vdec at the time t14 assuming that an overcurrent is flowing through the switching element S*#.

In other words, the border voltage Vbor is a value of the gate voltage Vge when the collector current Ic defined based on the sense voltage Vse reaches a determination current defined based on the sense determination voltage Vdec at the time t14 when it is assumed that an overcurrent is flowing through the corresponding switching element S*#.

In particular, the first voltage value Vjde1 according to the first embodiment is set to be higher than the border voltage Vbor, and the second voltage value Vjde2 according to the first embodiment is set to be lower than the border voltage Vbor. Note that the time t14 according to the first embodiment corresponds to, for example, an arrival timing.

This setting of the first and second determination voltages Vjde1 and Vjde2 results in (1) The time t13 at which the gate voltage Vge reaches the second determination voltage Vjde2 being earlier than the time t14 at which the gate voltage Vge reaches the border voltage Vbor (2) The time t15 at which the gate voltage Vge reaches the first determination voltage Vjde1 being later than the time t14 at which the gate voltage Vge reaches the border voltage Vbor This results in the sense voltage Vse reaching the sense determination voltage Vdec at the time t14 upon the temperature Tmp of the switching element S*# being the first temperature Tmp1. Thereafter, the sense voltage Vse reaches the first voltage value Vjde1 at the time t15 upon the temperature Tmp of the switching element S*# being the first temperature Tmp1. This therefore enables the drive controller 44 to determine that an overcurrent is flowing through the target switching element S*# at the time t15 upon the temperature Tmp of the switching element S*# being the first temperature Tmp1 (see step S22).

In contrast, upon the temperature Tmp of the switching element S*# being the second temperature Tmp2, the gate voltage Vge reaches the second determination voltage Vjde2 at the time t13, and thereafter, the sense voltage Vdec reaches the sense determination voltage Vdec at the time t14. That is, upon the temperature Tmp of the switching element S*# being the second temperature Tmp2, the drive controller 44 determines that an overcurrent is flowing through the target switching element S*# at the time t14 (see step S22). That is, the drive controller 44 determines that (1) An overcurrent is flowing through the target switching element S*# upon the temperature Tmp of the switching element S*# being the first temperature Tmp1 at a first timing (2) An overcurrent is flowing through the target switching element S*# upon the temperature Tmp of the switching element S*# being the second temperature Tmp2 at a second timing earlier than the first timing.

As described in detail above, the drive controller 44 for each switching element S*# according to the first embodiment is configured to perform the overcurrent determination routine for the corresponding switching element S*# that sets, upon the temperature Tmp of the corresponding switching element S*# being the second temperature Tmp2 higher than the first temperature Tmp1, the gate determination voltage Vjde to the second voltage value Vjde2 that is lower than the first voltage value Vjde1; the first voltage value Vjde1 is previously set for the first temperature Tmp1 of the corresponding switching element S*#. In the overcurrent determination routine, the lower the gate determination voltage Vjde is, the earlier whether an overcurrent is flowing through the corresponding switching element S*# is determined.

This configuration therefore enables whether an overcurrent is flowing through each switching element S*# to be determined earlier as compared with the case where the second voltage value Vjde2 is set to be the same as the first voltage value Vjde1.

This earlier determination of an overcurrent flowing results in a reduction of an integrated quantity of the collector current Ic that is flowing through each switching element S*# since the start of the charging task until it is determined that an overcurrent is flowing through the switching element S*#. This prevents a large amount of collector current Ic from flowing between the collector and emitter of each switching element S*#, thus preventing the reliability of each switching element S*# from deteriorating.

This earlier determination of an overcurrent flowing also prevents each high-side switching element S*p and the corresponding low-side switching element S*n from being simultaneously turned on, thus preventing the reliability of the motor-generator 10 from deteriorating.

The drive controller 44 for each switching element S*# according to the first embodiment is configured to determine whether an overcurrent is flowing through each switching element S*# using both the gate voltage Vge and the sense voltage Vse of the corresponding switching element S*#. This improves the reliability of the overcurrent detection accuracy as compared with the configuration that determines whether an overcurrent is flowing through each switching element S*# using merely the gate voltage Vge of the corresponding switching element S*#.

For example, even if a larger amplitude noise voltage than a noise voltage that is assumed to be added to the gate voltage Vge is applied to the gate voltage Vge of each switching element S*# so that the gate voltage Vge temporarily has exceeded the gate determination voltage Vjde while no overcurrent is flowing through the corresponding switching element S*#, the drive controller 44 according to the first embodiment prevents an erroneous determination that an overcurrent is flowing through the corresponding switching element S*#.

In particular, the second voltage value Vjde2 according to the first embodiment is set to be lower than the border voltage Vbor at which the gate voltage Vge of each switching element S*# is assumed to arrive when the sense voltage Vse reaches the sense determination voltage Vse while an overcurrent is flowing through the corresponding switching element S*#. This configuration enables whether an overcurrent is flowing through each switching element S*# is determined earlier than the case where the second voltage value Vjde2 is set to be higher than the border voltage Vbor.

The soft turnoff resistor 38 according to the first embodiment has the resistance Ra set to be higher than the resistance Rb of the discharging resistor 28. This enables the discharging rate of charge stored in the gate of each switching element S*# via the soft-turnoff discharge path including the soft turnoff resistor 38 to be lower than the discharging rate via the normal discharging path including the discharging resistor 28.

If the switching speed of the switching element S*# from the on state to the off state were high while an overcurrent is flowing through the switching element S*# as the corrector current Ic, there might be an excessively high surge voltage produced due to the high-speed shutdown of the switching element S*#. Thus, in this situation, the overcurrent protection task forcibly changes the resistance of the discharging path of the gate of each switching element S*# via the soft turnoff resistor 38 to be higher than that of the normal discharging path of the gate of the corresponding switching element S*# via the discharging resistor 28 in normal situations. This protects each switching element S*# against a surge produced due to the turn-off of the corresponding switching element S*#.

Second Embodiment

Figure 7:
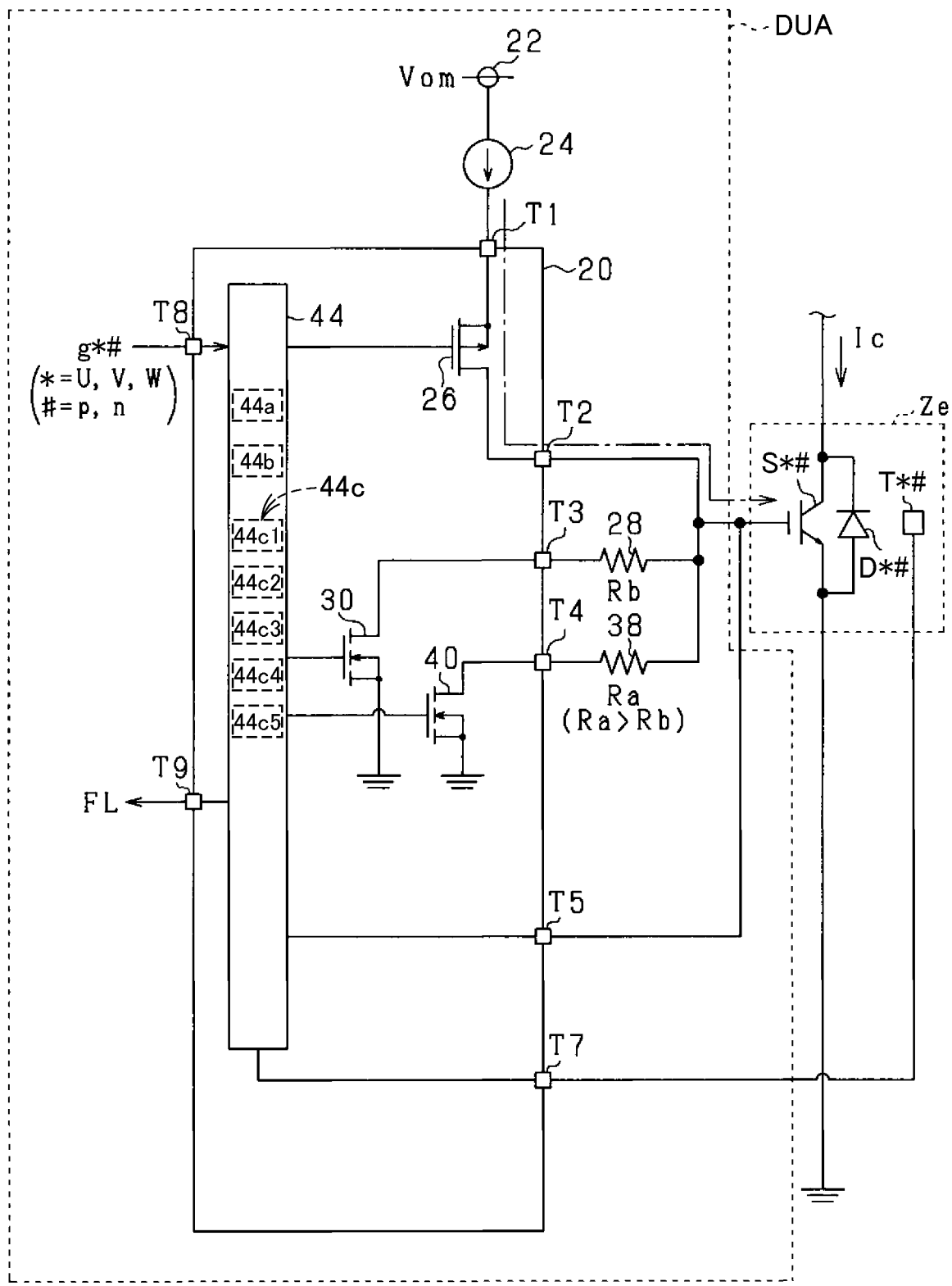
FIG. 7 is a circuit diagram schematically illustrating an example of the structure of each drive unit according to the second embodiment of the present disclosure.
Figure 8:
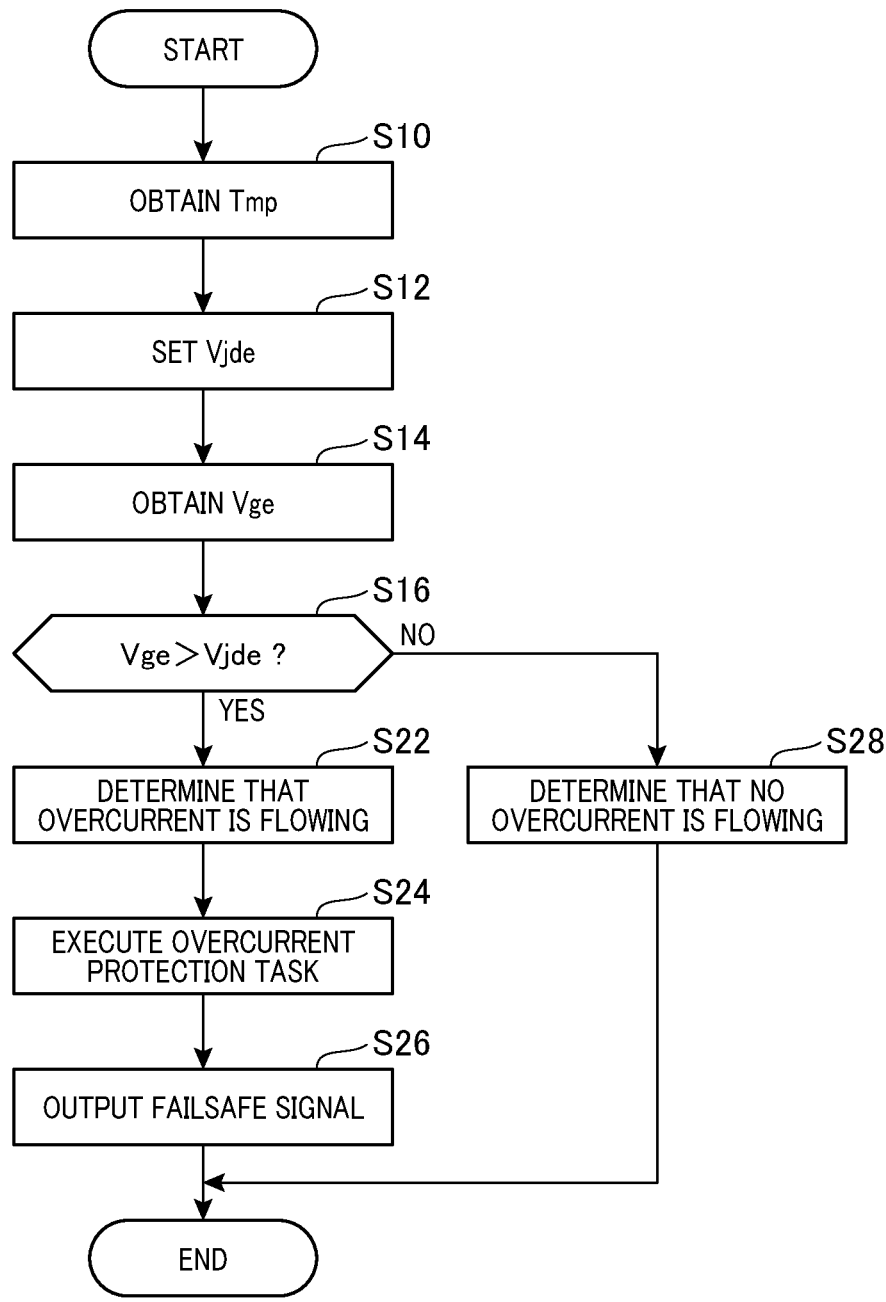
FIG. 8 is a flowchart schematically illustrating an example of an overcurrent determination routine carried out by each drive unit according to the second embodiment.

The following describes a drive unit DUA for each switching element S*# according to the second embodiment of the present disclosure with reference to FIGS. 7 and 8.

The structure and/or functions of the drive unit DUA according to the second embodiment are mainly identical to those of the drive unit DU according to the first embodiment except for the following points. So, the following describes mainly the different points.

From the drive unit DUA for each switching element S*# according to the second embodiment, the sense terminal, the sense resistor 42, and the sixth terminal T6 of the drive IC 20 has been eliminated as compared with the drive unit DU according to the first embodiment.

That is, the drive unit DUA according to the second embodiment is configured to determine whether an overflow current is flowing through each switching element S*# using the gate voltage Vge.

The following describes an overcurrent determination routine according to the second embodiment with reference to FIG. 8. A drive controller 44A executes the overcurrent determination routine for each switching element S*# every predetermined period during the overcurrent determination period.

Figure 3:
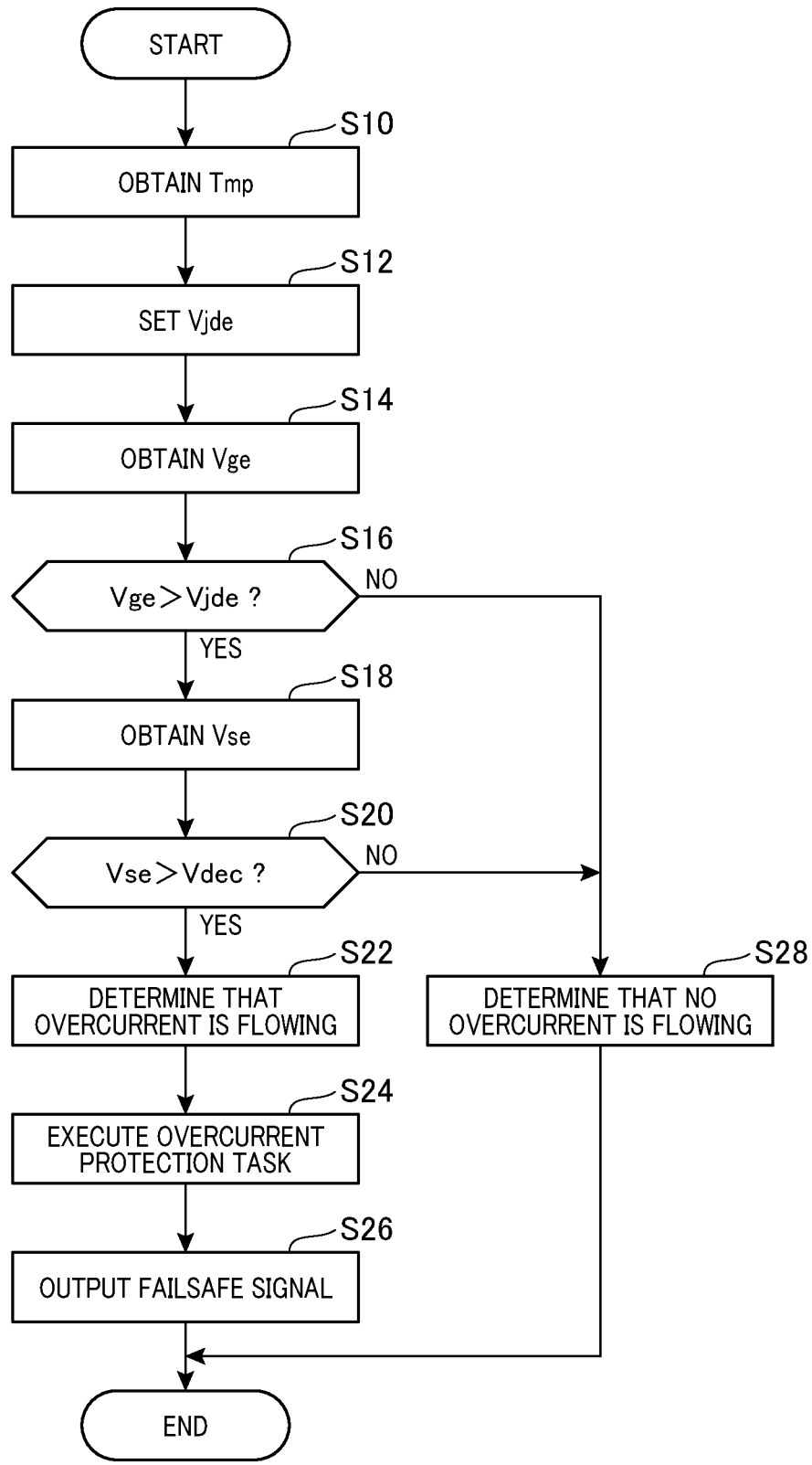
FIG. 3 is a flowchart schematically illustrating an example of an overcurrent determination routine carried out by each drive unit of the control system illustrated in FIG. 1.

Note that, in the overcurrent determination routines illustrated in respective FIGS. 3 and 8, like operations between the overcurrent determination routines illustrated in respective FIGS. 3 and 8, to which like step numbers are assigned, are omitted or simplified to avoid redundant description.

From the overcurrent determination routine illustrated in FIG. 8, the operations in steps S18 and S20 have been eliminated as compared with the overcurrent determination routine illustrated in FIG. 3.

Specifically, upon determining that the gate voltage Vge is higher than the gate determination voltage Vjde (YES in step S16), the drive controller 44 determines that an overcurrent is flowing through the switching element S*# in step S22.

Specifically, the drive controller 44A for each switching element S*# according to the second embodiment is configured to simply determine that an overcurrent is flowing through each switching element S*# upon determining that the gate voltage Vge has exceeded the gate determination voltage Vjde.

This configuration therefore enables, upon the gate determination voltage Vjde being set to be lower than the border voltage Vbor, whether an overcurrent is flowing through each switching element S*# to be determined earlier as compared with the case where the drive controller 44 performs the determination of whether an overcurrent is flowing through each switching element S*# using both the gate voltage Vge and the sense voltage Vse.

In particular, the drive controller 44 for each switching element S*# according to the first embodiment is configured to determine whether an overcurrent is flowing through each switching element S*# using merely the gate voltage Vge of the corresponding switching element S*#. This eliminates the sense terminal St, the sense resistor 42, and the sixth terminal T6, which are needed in the first embodiment. This results in the drive unit DUA having a simpler structure, resulting therefore in a smaller circuit board on which each drive unit DUA is mounted.

Third Embodiment

Figure 9:
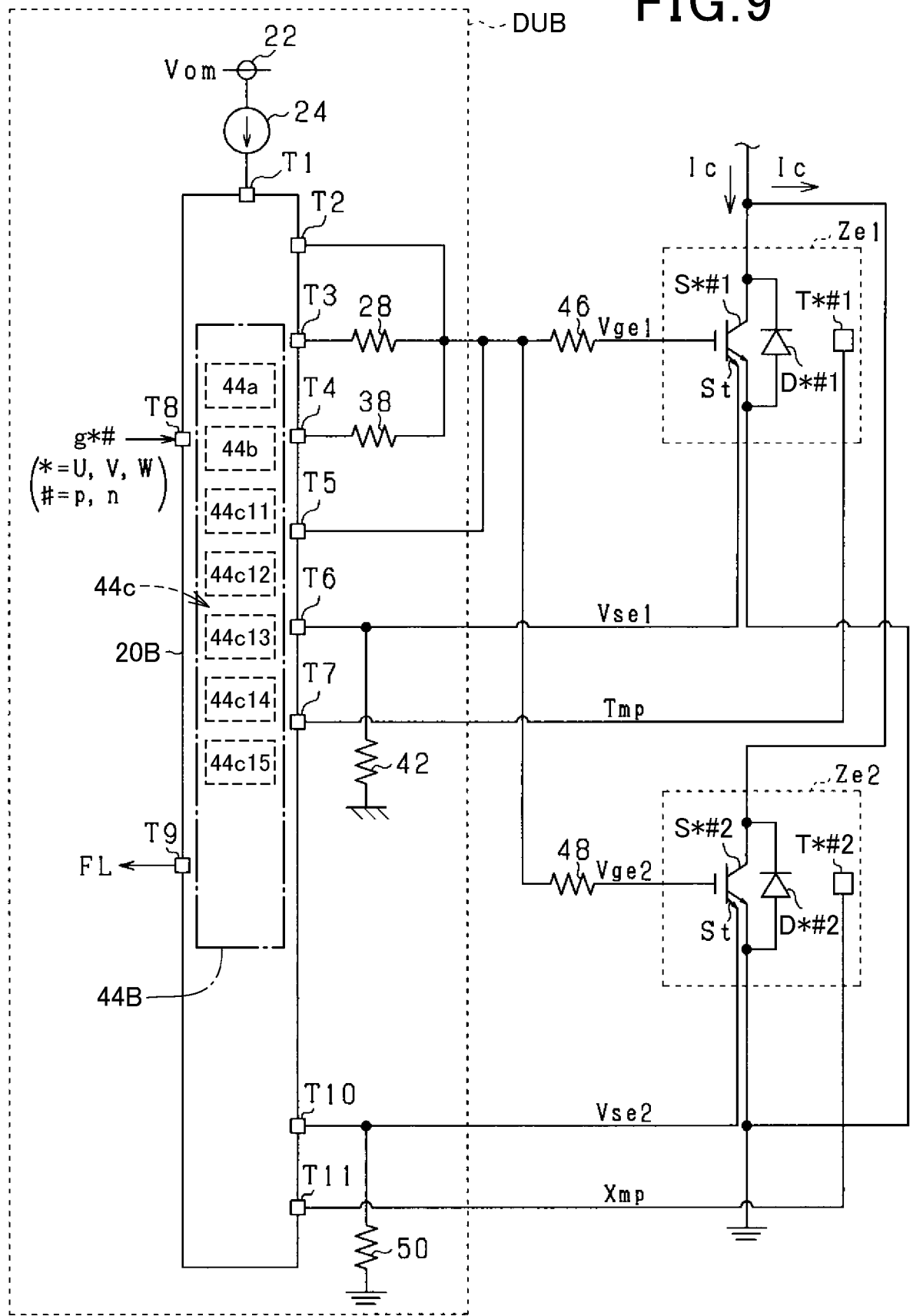
FIG. 9 is a circuit diagram schematically illustrating an example of the structure of each drive unit according to the third embodiment of the present disclosure.
Figure 10:
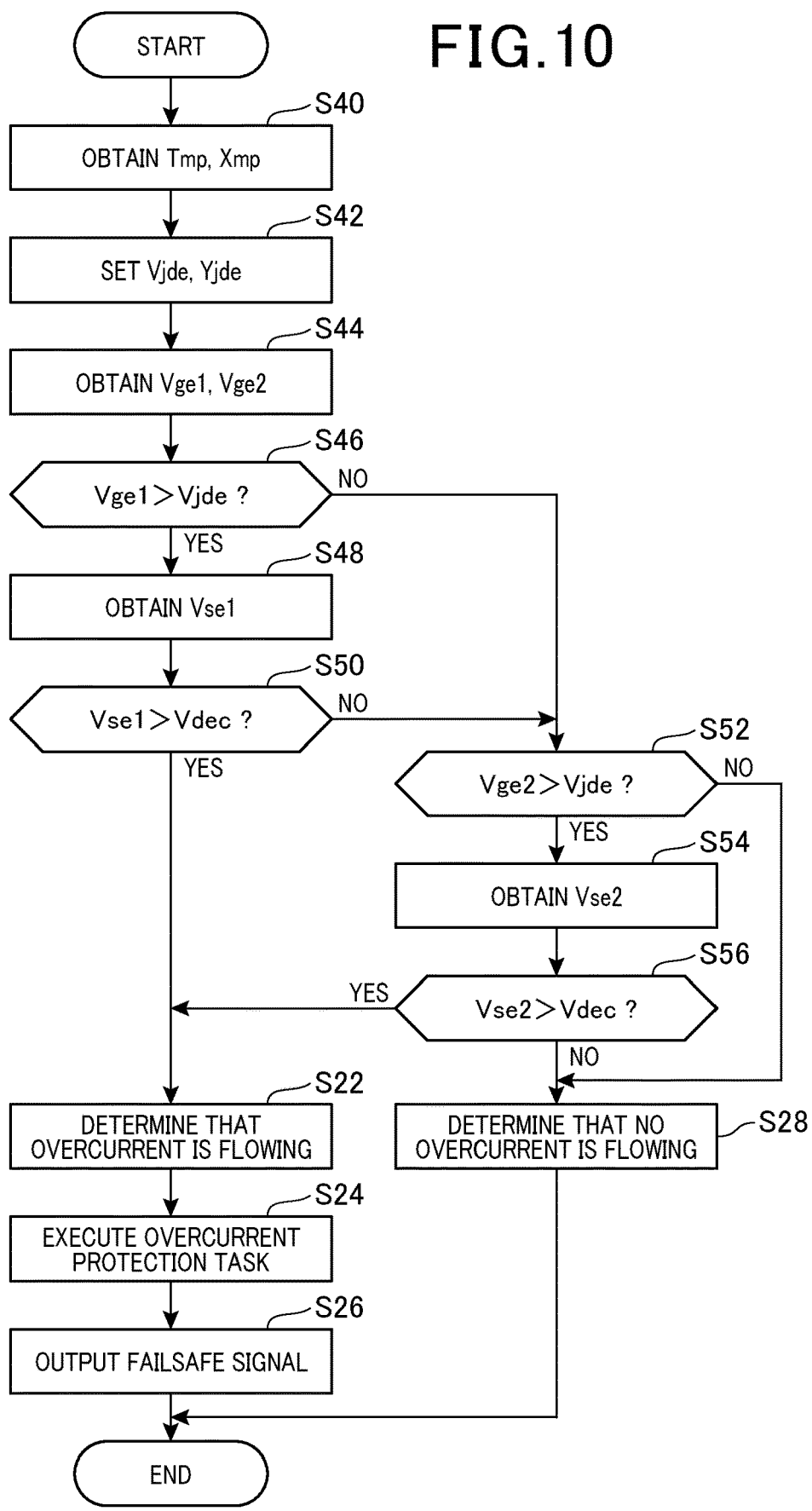
FIG. 10 is a flowchart schematically illustrating an example of an overcurrent determination routine carried out by each drive unit according to the third embodiment.

The following describes a drive unit DUB for each switching element S*# according to the third embodiment of the present disclosure with reference to FIGS. 9 and 10.

The structure and/or functions of the drive unit DUB according to the third embodiment are mainly identical to those of the drive unit DU according to the first embodiment except for the following points. So, the following describes mainly the different points.

Referring to FIG. 9, each switching element S*# according to the third embodiment is comprised of a first switching element S*#1 and a second switching element S*#2 parallely connected to each other. Specifically, each of first switching element S*#1 and a second switching element S*#2 is comprised of an IGBT, and the output terminals, i.e. emitters, of the first and second switching elements S*#1 and S*#2 are connected to each other, and the input terminals, i.e. collectors, of the first and second switching elements S*#1 and S*#2 are also connected to each other.

Referring to FIG. 9, the drive unit DUB for each switching element S*# includes a first gate resistor 46 and a second gate resistor 48.

The gate of the first switching element S*#1 is connected to the second terminal T2 of a drive controller 44B via the first gate resistor 46. This results in each of the discharging resistor 28 and the soft turnoff resistor 38 being connected to the gate of the first switching element S*#1 via the first gate resistor 46.

Additionally, the gate of the second switching element S*#2 is connected to the second terminal T2 via the second gate resistor 48. This results in each of the discharging resistor 28 and the soft turnoff resistor 38 being also connected to the gate of the second switching element S*#2 via the second gate resistor 48.

That is, the gates of the first and second switching elements S*#1 and S*#2 are commonly connected to the second terminal T2 via the respective first and second gate resistors 46 and 48. Note that the second terminal T2 serves as, for example, a charging terminal.

This connection configuration enables a gate voltage Vge1 at the gate of the first switching element S*#1 and a gate voltage Vge2 at the gate of the second switching element S*#2 to be estimated based on the voltage at the second terminal T2. The second terminal T2 according to the third embodiment is connected to the drive controller 44B via the fifth terminal T5, so that the voltage at the second terminal T2 is input to the drive controller 44B. This enables the drive controller 44B to simultaneously obtain both the first and second gate voltages Vge1 and Vge2 based on the voltage at the second terminal T2 input thereto.

The inverter 11 according to the third embodiment includes first flywheel diodes D*#1 electrically connected in antiparallel to the respective first switching elements S*#1, and also includes second flywheel diodes D*#2 electrically connected in antiparallel to the respective second switching elements S*#2.

The inverter 11 also includes first temperature-sensitive sensors T*#1 located to be close to the respective first switching elements S*#1, and includes second temperature-sensitive sensors T*#2 located to be close to the respective second switching elements S*#2. Specifically, each first semiconductor switch Ze1 is comprised of the corresponding first switching element S*#1, the corresponding first flywheel diode D*#1, and the corresponding first temperature-sensitive sensor T*#1 packaged therein. In addition, each second semiconductor switch Ze2 is comprised of the corresponding second switching element S*#2, the corresponding second flywheel diode D*#2, and the corresponding second temperature-sensitive sensor T*#2 packaged therein.

The drive unit DUB includes a drive IC 20B that additionally has tenth and eleventh terminals T10 and T11, and includes a drive controller 44B.

The sense resistor 42 according to the first embodiment serves as a first sense resistor 42 provided for each first switching element S*#1, so that the first end of the first sense resistor 42 is connected to the sense terminal St of the corresponding first switching element S*#1, and the second end of the first sense resistor 42 is connected to the common signal ground. The first end of the first sense resistor 42 is connected to the sixth terminal T6 of the drive controller 44B.

This enables the drive controller 44B to obtain the voltage drop across the first sense resistor 42 as a first sense voltage value Vse1 at the first end of the first sense resistor 42 connected to the sense terminal St.

Each drive unit DUB additionally includes a second sense resistor 50 provided for each second switching element S*#2, so that the first end of the second sense resistor 50 is connected to the sense terminal St of the corresponding second switching element S*#2, and the second end of the second sense resistor 50 is connected to the common signal ground. The first end of the second sense resistor 50 is connected to the tenth terminal T10 of the drive controller 44B.

This enables the drive controller 44B to obtain the voltage drop across the second sense resistor 52 as a second sense voltage value Vse2 at the first end of the second sense resistor 50 connected to the sense terminal St.

The temperature Tmp of the first switching element S*#1 measured by the first temperature-sensitive sensor T*#1 is input to the drive controller 44B via the seventh terminal T7. Similarly, the temperature, referred to as Xmp, of the second switching element S*#2 measured by the second temperature-sensitive sensor T*#2 is input to the drive controller 44B via the seventh terminal T11.

Note that, for the sake of simply illustration of the drive unit DUB, the switching elements 26, 30, and 40 are not illustrated, but the drive unit DUB includes the switching elements 26, 30, and 40, which is similar to the drive unit DU of the first embodiment.

The following describes an overcurrent determination routine according to the third embodiment with reference to FIG. 10. The drive controller 44B executes the overcurrent determination routine for each pair of the first and second switching elements S*#1 and S*#2 every predetermined period during the overcurrent determination period.

Note that, in the overcurrent determination routines illustrated in respective FIGS. 3 and 10, like operations between the overcurrent determination routines illustrated in respective FIGS. 3 and 10, to which like step numbers are assigned, are omitted or simplified to avoid redundant description.

Upon starting the overcurrent determination routine for each pair of the first and second switching elements S*#1 and S*#2, the drive controller 44B, i.e. the overcurrent determination unit 44c, obtains a first temperature parameter indicative of the temperature Tmp of the switching element S*#, such as the temperature Tmp of the first switching element S*#1 itself, from the first temperature-sensitive sensor T*#1 in step S40.

In step S40, the drive controller 44B also obtains a second temperature parameter indicative of the temperature Xmp of the second switching element S*#2, such as the temperature Xmp of the second switching element S*#2 itself, from the second temperature-sensitive sensor T*#2 in step S40. Note that the temperature Tmp according to the third embodiment corresponds to, for example, a first temperature measurement value according to the third embodiment, and the temperature Xmp according to the third embodiment corresponds to, for example, a second temperature measurement value according to the third embodiment. The operation in step S40 corresponds to, for example, a temperature obtainer 44c11.

Next, the drive controller 44B sets a value of a gate determination voltage Vjde for the first switching element S*#1, and sets a value of a gate determination voltage Yjde for the second switching element S*#2 in step S42.

For example, in step S42, the drive controller 44B sets the gate determination voltages Vjde and Yjde in accordance with the correlation data G1A and the correlation data G2A described above and stored in FIG. 11 stored therein. Note that the operation in step S42 serves as, for example, a setter 44c12.

Figure 11:
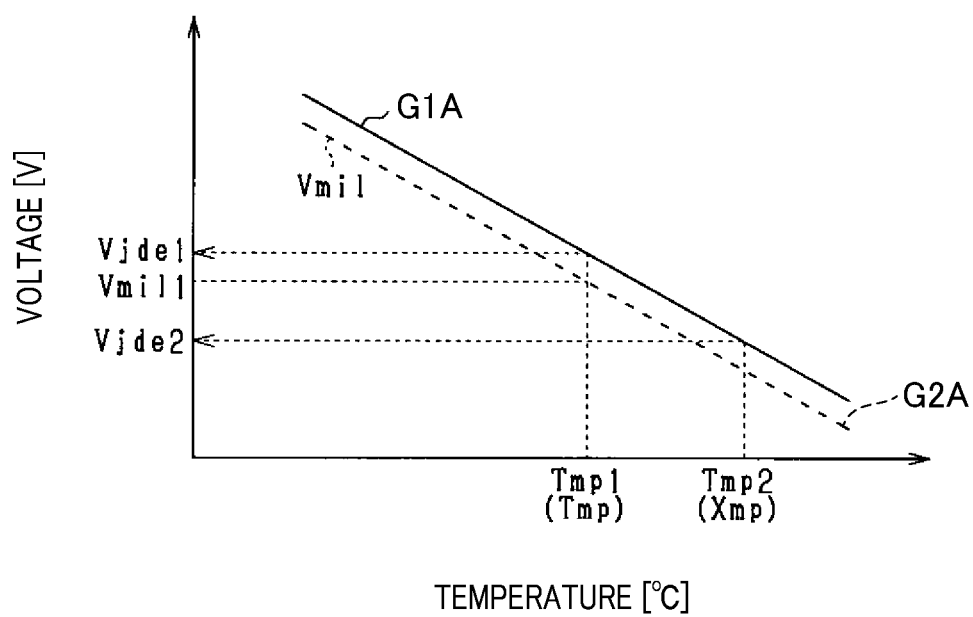
FIG. 11 is a graph schematically illustrating (1) An example of the relationships between the temperature of a switching element and a gate determination voltage (2) An example of the relationships between the temperature of the switching element and a Miller voltage according to the third embodiment.

In FIG. 11, the correlation data G1A shows that a variable for each of the gate determination voltages Vjde and Yjde has a negative correlation with the temperature Tmp, Xmp of the corresponding switching element.

The correlation data G2A shows that the Miller voltage Vmil for each of the first and second switching elements S*#1 and S*#2 has a negative correlation with the temperature Tmp, Xmp of the corresponding switching element.

That is, the higher the temperature Tmp, Xmp for each of the first and second switching elements S*#1 and S*#2 is, the lower the gate determination voltage Vjde, Yjde for the corresponding one of the first and second switching elements S*#1 and S*#2 is. Similarly, the higher the temperature Tmp for each of the first and second switching elements S*#1 and S*#2 is, the lower the Miller voltage for the corresponding one of the first and second switching elements S*#1 and S*#2 is.

For this reason, when the first temperature Tmp1 is set to be lower than the second temperature Tmp2, the first voltage value Vjde1 corresponding to the temperature Tmp of each of the first and second switching elements S*#1 and S*#2 being the first temperature Tmp1 is higher than the second voltage value Vjde2 corresponding to the temperature Tmp of each of the first and second switching elements S*#1 and S*#2 being the second temperature Tmp2.

Specifically, in step S42, the drive controller 44B compares the temperature Tmp of the first switching element S*#1 with the temperature Xmp of the second switching element S*#2, and selects the lower temperature in the temperatures Tmp and Xmp. Then, the drive controller 44B refers to the correlation data G1A to thereby select a value of the variable for each of the gate determination voltages Vjde and Yjde at the selected temperature as the corresponding one of the gate determination voltages Vjde and Yjde in step S42.

For example, in step S42, the drive controller 44B sets each of the gate determination voltages Vjde and Yjde to the first voltage value Vjde1 corresponding to the first temperature Tmp1 assuming that the temperature Tmp of the first switching element S*#1 being the first temperature Tmp1, and the temperature Xmp of the second switching element S*#2 being the second temperature Tmp2.

In step S44, the drive controller 44B obtains the voltage at the second terminal T2 to thereby obtain the first gate voltage Vge1 of the first switching element S*#1 and the second gate voltage Vge2 of the second switching element S*#2. The operation in step S44 corresponds to, for example, a voltage obtainer 44c13.

In step S46, the drive controller 44B determines whether the first gate voltage Vge1 is higher than the gate determination voltage Vjde.

Upon determining that the first gate voltage Vge1 is higher than the gate determination voltage Vjde (YES in step S46), the drive controller 44B obtains the first sense voltage value Vse1 in step S48. Then, the drive controller 44B determines whether the first sense voltage value Vse1 is higher than the determination voltage Vdec in step S50. The operation in step S48 corresponds to, for example, a current parameter obtainer 44c14.

Upon determining that the first sense voltage value Vse1 is higher than the sense determination voltage Vdec (YES in step S50), that is, upon determining that the first gate voltage Vge1 is higher than the gate determination voltage Vjde and the first sense voltage value Vse1 is higher than the sense determination voltage Vdec, the drive controller 44B determines that an overcurrent is flowing through the first switching element S*#1 in step S22.

Otherwise, upon determining that the first gate voltage Vge1 is equal to or lower than the gate determination voltage Vjde (NO in step S46) or that the first sense voltage value Vse1 is equal to or lower than the sense determination voltage Vdec (NO in step S50), the drive controller 44B determines whether the second gate voltage Vge2 is higher than the gate determination voltage Yjde in step S52.

Upon determining that the second gate voltage Vge2 is higher than the gate determination voltage Yjde (YES in step S52), the drive controller 44B obtains the second sense voltage value Vse2 in step S54. Then, the drive controller 44B determines whether the second sense voltage value Vse2 is higher than the determination voltage Vdec in step S56.

Upon determining that the second sense voltage value Vse2 is higher than the sense determination voltage Vdec (YES in step S56), that is, upon determining that the second gate voltage Vge2 is higher than the gate determination voltage Yjde and the second sense voltage value Vse2 is higher than the sense determination voltage Vdec, the drive controller 44B determines that an overcurrent is flowing through the second switching element S*#2 in step S22.

Otherwise, upon determining that the second gate voltage Vge2 is equal to or lower than the gate determination voltage Yjde (NO in step S52) or that the second sense voltage Vse is equal to or lower than the sense determination voltage Vdec (NO in step S56), the drive controller 44B determines that no overcurrent is flowing through the switching element S*#, terminating the overcurrent determination routine.

Note that the drive controller 44B can be comprised of, for example, a processor and a processor-readable memory, such as a processor-readable nonvolatile memory, for example, a non-transitory memory, storing program instructions. That is, the processor can run the program instructions to thereby execute the operations in steps S40 to S56 and S22 to S26, in other words, to thereby implement at least the modules 44c11 to 44c14 and 44c5. As another example, the drive controller 44B can be comprised of hardwired logic circuits that can implement the operations in steps S40 to S56 and S22 to S26, that is, that can respectively serve as at least the modules 44c11 to 44c14 and 44c5. As a further example, the drive controller 44 can be comprised of hardwired/programmed hybrid logic circuits that can implement the operations in steps S40 to S56 and S22 to S26S, that is, that can respectively serve as at least the modules 44c11 to 44c14 and 44c5.

As described above, the drive controller 44B for each of the first and second switching elements S*#1 and S*#2 according to the third embodiment is configured to set each of the gate determination voltage Vjde for the first switching element S*#1 and the gate determination voltage Yjde for the second switching element S*#2 to a same voltage. This therefore results in lower processing load of the drive controller 44B during execution of the overcurrent determination routine as compared with the case where the drive controller 44B sets the gate determination voltage Vjde for the first switching element S*#1 and the gate determination voltage Yjde to respectively different voltages.

In particular, the drive controller 44B according to the third embodiment is configured to set each of the gate determination voltage Vjde for the first switching element S*#1 and the gate determination voltage Yjde for the second switching element S*#2 in accordance with the lower temperature in the temperature Tmp of the first switching element S*#1 and the temperature Xmp of the second switching element S*#2.

For example, as illustrated in FIG. 11, it is assumed that (1) The temperature Tmp of the first switching element S*#1 is the first temperature Tmp1

(2) The temperature Xmp of the second switching element S*#2 is the second temperature Tmp2

(3) Each of the gate determination voltages Vjde and Yjde is set to the second voltage value Vjde2 corresponding to the higher temperature in the temperature Tmp of the first switching element S*#1 and the temperature Xmp of the second switching element S*#2

In this assumption, the second voltage value Vjde2 set for the gate determination voltage Vjde of the first switching element S*#1 would be lower than the Miller voltage Vmil1 at the temperature Tmp of the first switching element S*#1. This would cause the driver controller 44B to erroneously determine that an overcurrent is flowing through the first switching element S*#1.

In contrast, the drive controller 44B according to the third embodiment is configured to set each of the gate determination voltage Vjde for the first switching element S*#1 and the gate determination voltage Yjde for the second switching element S*#2 in accordance with the lower temperature in the temperature Tmp of the first switching element S*#1 and the temperature Xmp of the second switching element S*#2. This results in reduction of the possibility of such an erroneous determination.

The drive unit DUB according to the third embodiment is configured such that the gates of the first and second switching elements S*#1 and S*# are commonly connected to the second terminal T2 via the respective first and second gate resistors 46 and 48.

This connection configuration enables the drive controller 44B to simultaneously obtain both the first and second gate voltages Vge1 and Vge2 based on the voltage at the second terminal T2 input thereto. This results in the drive controller 44B having one terminal, i.e. the fifth terminal T5, for obtaining both the first and second gate voltages Vge1 and Vge2. This therefore results in a reduction of the number of terminals needed for the drive controller 44B as compared with the configuration that a drive controller has two terminals for respectively obtaining the first and second gate voltages Vge1 and Vge2 in addition to the above benefits obtained in the first embodiment.

Fourth Embodiment

Figure 12:
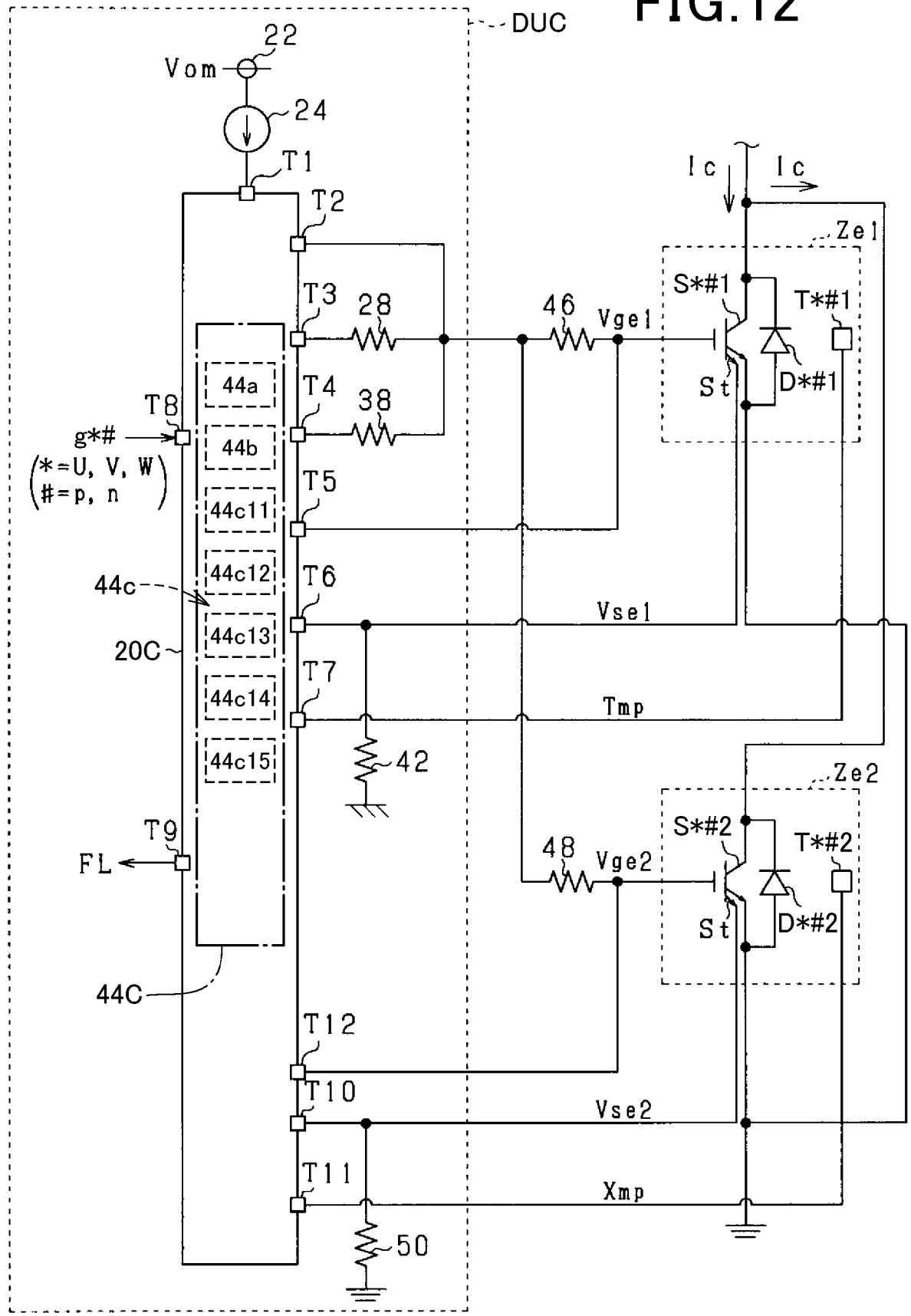
FIG. 12 is a circuit diagram schematically illustrating an example of the structure of each drive unit according to the fourth embodiment of the present disclosure.

The following describes a drive unit DUC for each switching element S*# according to the fourth embodiment of the present disclosure with reference to FIG. 12.

The structure and/or functions of the drive unit DUC according to the fourth embodiment are mainly identical to those of the drive unit DUB according to the third embodiment except for the following points. So, the following describes mainly the different points.

Referring to FIG. 12, the fifth terminal T5 of a drive IC 20c of the drive unit DUC is connected to a signal line between the first gate resistor 46 and the gate of the first switching element S*#1. In addition, the drive IC 20c of the drive unit DUC has a twelfth terminal T12 connected to a signal line between the second gate resistor 48 and the gate of the second switching element S*#2.

This enables a drive controller 44C of the drive unit DUC to individually obtain the first and second gate voltages Vge1 and Vge2 through the respective fifth and twelfth terminals T5 and T12.

The drive controller 44C is configured to execute an overcurrent determination routine according to the fourth embodiment, which is slightly different from the overcurrent determination routine according to the third embodiment in the following points.

Specifically, in step S42, the drive controller 44C individually sets the gate determination voltages Vjde and Yjde in accordance with the correlation data G1A described above and stored in FIG. 11 stored therein.

Specifically, in step S42, the drive controller 44C sets, in accordance with the correlation data G1A, the gate determination voltage Vjde for the first switching element S*#1 to a voltage value corresponding to the temperature Tmp of the first switching element S*#1 in accordance with the correlation data G1A. In addition, in step S42, the drive controller 44C sets, in accordance with the correlation data G1A, the gate determination voltage Yjde for the second switching element S*#2 to a voltage value corresponding to the temperature Xmp of the second switching element S*#2 in accordance with the correlation data G1A.

As described above, the drive unit DUC according to the fourth embodiment is configured to individually and directly obtain the first and second gate voltages Vge1 and Vge2 through the respective fifth and twelfth terminals T5 and T12 with little influence from the gate resistors 46 and 48.

This configuration therefore enables the first and second gate voltages Vge1 and Vge2 to be obtained with higher accuracy.

The drive unit DUC is configured to individually set the gate determination voltages Vjde and Yjde in accordance with the correlation data G1A. This configuration enables the gate determination voltages Vjde and Yjde to be set based on the temperatures of the respective first and second switching elements S*#1 and S*#2.

Modifications

The present disclosure is not limited to the above first to fourth embodiments, and each of the first to fourth embodiments of the present disclosure can be modified as described hereinafter.

Each of the first to fourth embodiments is configured to address a situation where there is no Miller period in the change trajectory of the gate voltage Vge of a switching element S*# from the off state to the on state due to the flow of an overcurrent through the switching element S*#. The present disclosure is however not limited to this configuration.

Specifically, each of the first to fourth embodiments can be configured to address a situation where there is a shorter Miller period in the change trajectory of the gate voltage Vge of a switching element S*# from the off state to the on state due to the magnitude of an overcurrent flowing through the switching element S*#. Specifically, while an overcurrent is flowing through a switching element S*#, the gate voltage Vge of the switching element S*# becomes higher than the gate determination voltage Vjde and the sense voltage Vse becomes higher than the sense determination voltage Vse during a predetermined overcurrent determination period. For this reason, each of the first to fourth embodiments makes it possible to determine that there is an overcurrent flowing through each switch S*# independently of the magnitude of an overcurrent flowing through the switching element S*#.

Each of the drive controllers 44 and 44A to 44C is configured to obtain the temperature Tmp of each switching element S*# itself, but the present disclosure is not limited thereto.

Specifically, each of the drive controllers 44 and 44A to 44C can be configured to (1) Obtain, as the temperature parameter of each switching element S*#, a physical value, such as a voltage, correlating with the temperature Tmp of each switching element S*# or (2) Obtain, as each of the first and second temperature parameters of the respective first and second switching elements S*#1 and S*#2, a physical value, such as a voltage, correlating with the corresponding one of the temperatures Tmp and Xmp of the corresponding one of the first and second switching elements S*#1 and S*#2

For example, a thermoelectric conversion element can be provided for each switching element S*#, and the thermoelectric conversion element can be configured to output a voltage correlating with the temperature of the corresponding switching element S*#. Then, each of the drive controllers 44 and 44A to 44C can be configured to obtain the voltage correlating with the temperature of each corresponding switching element S*#, thus obtaining the temperature of the corresponding switching element S*#.

Each of the drive controllers 44 and 44A to 44C is configured to obtain the sense voltage Vs of each switching element S*# as a current parameter correlating with an inter-terminal current, such as the collector current Ic, flowing through between the pair of main terminals of the corresponding switching element S*#, but the present disclosure is not limited thereto.

Specifically, each of the drive controllers 44 and 44A to 44C can be configured to obtain, as the current parameter, a current flowing between the sense terminal and the emitter of each switching element S*#, which correlates with the inter-terminal current, measured by, for example, a current sensor included in the corresponding drive unit. As another example, each of the drive controllers 44 and 44A to 44C can be configured to obtain, as the current parameter, a collector-emitter voltage, which correlates with the collector current Ic, measured by, for example, a voltage sensor included in the corresponding drive unit.

Each of the first and second embodiments is configured to continuously reduce the gate determination voltage of each switching element S*# down to the second voltage value Vjde2, which is lower than the first voltage value Vjde1, with an increase of the measured temperature Tmp of the corresponding switching element S*# when the measured temperature Tmp of the corresponding switching element S*# is the second temperature Tmp2 higher than the first temperature Tmp1. The present disclosure is however not limited to the configuration. For example, the present disclosure can be configured to set the gate determination voltage Vjde of each switching element S*# to be stepwisely lower as the temperature Tmp of the corresponding switching element S*# becomes higher. Note that the present disclosure can be configured to set the gate determination voltage Vjde of each switching element S*# to be stepwisely lower in at least two steps as the temperature Tmp of the corresponding switching element S*# becomes higher.

Each of the drive units DUB and DUC according to the third and fourth embodiments can include each switching element S*# comprised of two switching elements parallely connected to each other, but the present disclosure is not limited thereto. Specifically, each switching element S*# can be comprised of three or more switching elements parallely connected to each other, but the present disclosure is not limited thereto.

If, for example, each switching element S*# is comprised of three switching elements parallely connected to each other, the drive controller 44 can be configured to execute, in step S42, (1) Obtain the temperatures of the respective three switching elements (2) Select the lowest temperature in the obtained temperatures (3) Refer to the correlation data G1A to thereby select a value of the variable for the gate determination voltage of each switching element at the selected lowest temperature, thus commonly setting the selected value as the gate determination voltage for each switching element Note that each of the drive controllers 44C and 44D according to the third and fourth embodiments can be configured to execute the overcurrent determination routine illustrated in FIG. 10 without executing the overcurrent determination routine illustrated in FIG. 3 for each of the first and second switching elements parallely connected to each other. This is because executing merely the overcurrent determination routine illustrated in FIG. 10 for the pair of first and second switching elements achieves a sufficient benefit. For this reason, each of the drive controllers 44C and 44D according to the third and fourth embodiments can be configured to execute the overcurrent determination routine illustrated in FIG. 3 for each of the first and second switching elements parallely connected to each other, or not to execute the overcurrent determination routine illustrated in FIG. 3 for each of the first and second switching elements parallely connected to each other.

When it is determined that an overcurrent is flowing through a switching element S*#, the drive controller is configured to set the resistance value of the gate discharging path to be higher than the resistance value of the normal gate discharging path, thus discharging the gate of the switching element S*# at a discharging rate lower than a normal discharging rate in which it is determined that no overcurrent is flowing through the switching element S*# in step S24, but the present disclosure is not limited to this configuration.

As a first modification, from the structure of each drive unit DU illustrated in FIG. 2, the fourth terminal T4, soft turnoff resistor 38, and soft turnoff switching element 40 are eliminated. Then, a power supply unit 50, which is comprised of a switching element, such as a MOSFET, and a constant current power source, is provided in each drive unit DU (see an imaginary block 50). The constant current power source is connected to the connection line between the third terminal T3 and the discharging switching element 30.

Specifically, the drive controller 44 according to the first modification turns on the switching element of the power supply unit 50 in step S24 to thereby supply electrical charge from the constant current power source to the connection line between the third terminal T3 and the discharging switching element 30. This enables the discharging rate of the gate of the switching element S*# during the occurrence of an overflow through the switching element S*# to be slower than the discharging rate of the gate of the switching element S*# during no occurrence of an overflow through the switching element S*#.

As a second modification, from the structure of each drive unit DU illustrated in FIG. 2, the fourth terminal T4, soft turnoff resistor 38, and soft turnoff switching element 40 are eliminated.

Specifically, each drive unit DU according to the second modification includes a switching element, such as a MOSFET, 52 connected to the source of the discharging switching element 30 and also connected to the drive controller 44 (see an imaginary block 52). Each drive unit DU according to the second modification also includes a power source 53 having a potential higher than the emitter of the switching element S*# (see an imaginary block 53).

Specifically, the drive controller 44 according to the second modification electrically turns on the switching element in step S24 to thereby cause the discharging rate of the gate of the switching element S*# during the occurrence of an overflow through the switching element S*# to be slower than the discharging rate of the gate of the switching element S*# during no occurrence of an overflow through the switching element S*#.

Each of the first to fourth embodiments is configured such that the constant current power source 24 supplies electrical charge to the open-close control terminal of each switching element S*# in a constant current control mode, but the present disclosure is not limited thereto. Specifically, the constant current power source 24 can be eliminated from each drive unit DU illustrated in FIG. 2, and the constant voltage power source 22 can be connected to the first terminal T1. This causes the constant voltage power source 22 to supply electrical charge to the open-close control terminal of each switching element S*# in a constant voltage control mode.

In each of the first to fourth embodiments, an IGBT is used as each switching element S*#, but the present disclosure is not limited thereto. A MOSFET can be used as each switching element S*#.

In each of the first to fourth embodiments, the inverter 11 is used as a switching circuit, but another type of switching circuits, such as a full bridge circuit, can be used.

While illustrative embodiments of the present disclosure have been described herein, the present disclosure is not limited to the embodiment described herein, but includes any and all embodiments having modifications, omissions, combinations (e.g., of aspects across various embodiments), adaptations and/or alternations as would be appreciated by those in the art based on the present disclosure. The limitations in the claims are to be interpreted broadly based on the language employed in the claims and not limited to examples described in the present specification or during the prosecution of the application, which examples are to be construed as non-exclusive.

What is claimed is:

1. An overcurrent determining apparatus applicable to a switching circuit that includes:
   a switching element having first and second main terminals and an open-close control terminal; and
   a charging unit configured to supply electrical charge to the open-close control terminal of the switching element to thereby charge the open-close control terminal, the overcurrent determining apparatus being configured to execute an overcurrent determination routine to determine whether an overcurrent is flowing through the pair of first and second main terminals of the switching element based on whether a predetermined condition that a terminal voltage at the open-close control terminal of the switching element is higher than a determination voltage is satisfied, the overcurrent determining apparatus comprising:
a temperature obtainer configured to obtain a temperature parameter indicative of a temperature of the switching element as a temperature measurement value, the determination voltage having a first voltage value when the temperature measurement value is a first temperature; and
a setter configured to set the determination voltage to a second voltage value upon determining that the temperature measurement value is a second temperature which is higher than the first temperature, the second voltage value being lower than the first voltage value and higher than a value of a Miller voltage of the switching element at the second temperature.

2. The overcurrent determining apparatus according to claim 1, wherein:
the condition that the terminal voltage is higher than the determination voltage is defined as a first condition;
the predetermined condition includes a second condition that an inter-terminal current parameter indicative of an inter-terminal current flowing through the pair of first and second main terminals is higher than a current-related determination value; and
the second voltage value is set to be lower than a border voltage, the border voltage being a value of the terminal voltage at a timing when the inter-terminal current parameter reaches the current-related determination value when it is assumed that an overcurrent is flowing through the pair of first and second main terminals of the switching element.

3. The overcurrent determining apparatus according to claim 2, further comprising:
a voltage obtainer configured to obtain the terminal voltage;
a current parameter obtainer configured to obtain the inter-terminal current parameter indicative of the inter-terminal current; and
a determiner configured to:
determine:
whether the first condition that the terminal voltage obtained by the voltage obtainer is higher than the determination voltage is satisfied; and
whether the second condition that a value of the inter-terminal current parameter is higher than the current-related determination value is satisfied; and
determine that an overcurrent is flowing through the switching element upon determining that the first and second conditions are satisfied.

4. The overcurrent determining apparatus according to claim 1, wherein:
the switching element comprises at least first and second switching elements parallely connected to each other;
the temperature obtainer is configured to obtain, as the temperature parameter, at least first and second temperature parameters respectively indicative of temperatures of the at least first and second switching elements, the at least first and second temperature parameters being respectively referred to as at least first and second temperature measurement values; and
the setter has correlation data indicative of a relationship between the determination voltage and each of the at least first and second temperature measurement values such that, the higher each of the at least first and second temperature measurement values is, the lower the determination voltage is,
the setter being configured to commonly set a value of the determination voltage for each of the first and second switching elements to a selected value on the correlation data, the selected value corresponding to the lowest value in the at least first and second temperature measurement values.

5. The overcurrent determining apparatus according to claim 4, wherein:
the charging unit has a charging terminal for charging the open-close control terminal of each of the first and second switching elements; and
the open-close control terminal of each of the first and second switching elements is connected to the charging terminal of the charging unit,
the overcurrent determining apparatus further comprising:
a voltage obtainer configured to obtain a voltage at the charging terminal to thereby obtain the terminal voltage of each of the first and second switching elements.

6. The overcurrent determining apparatus according to claim 5, further comprising:
a current parameter obtainer configured to obtain an inter-terminal current parameter indicative of the inter-terminal current for each of the first and second switching elements; and
a determiner configured to:
determine, for at least one of the first and second switching elements, whether:
a first condition, which is the condition, that the terminal voltage of the at least one of the first and second switching elements obtained by the voltage obtainer is higher than the determination voltage is satisfied; and
a second condition that a value of the corresponding inter-terminal current parameter of the at least one of the first and second switching elements is higher than a current-related determination value is satisfied; and
determine that an overcurrent is flowing through the at least one of the first and second switching elements upon determining that the first and second conditions are satisfied.

7. The overcurrent determining apparatus according to claim 1, wherein:
the switching element comprises at least first and second switching elements parallely connected to each other;
the temperature obtainer configured to obtain, as the temperature parameter, a first temperature parameter indicative of a temperature of the first switching element as a first temperature measurement value, and a second temperature parameter indicative of a temperature of the second switching element as a second temperature measurement value; and
the setter has correlation data indicative of the relationship between the determination voltage and each of the at least first and second temperature measurement values such that, the higher each of the at least first and second temperature measurement values is, the lower the determination voltage is,
the setter being configured to individually set a value of the determination voltage for each of the first and second switching elements to a selected value on the correlation data, the selected value for the first switching element corresponding to the first temperature measurement value, the selected value for the second switching element corresponding to the second temperature measurement value.

8. The overcurrent determining apparatus according to claim 7, further comprising:
a voltage obtainer configured to obtain a voltage at the charging terminal to thereby obtain the terminal voltage of each of the first and second switching elements;
a current parameter obtainer configured to obtain an inter-terminal current parameter indicative of the inter-terminal current for each of the first and second switching elements; and
a determiner configured to:
determine, for at least one of the first and second switching elements, whether:
a first condition, which is the condition, that the terminal voltage of the at least one of the first and second switching elements obtained by the voltage obtainer is higher than the determination voltage is satisfied; and
a second condition that a value of the corresponding inter-terminal current parameter of the at least one of the first and second switching elements is higher than a current-related determination value is satisfied; and
determine that an overcurrent is flowing through the at least one of the first and second switching elements upon determining that the first and second conditions are satisfied.

9. The overcurrent determining apparatus according to claim 3, further comprising:
a normal turnoff unit configured to discharge the open-close control terminal of the switching element at a first discharging rate upon it being determined that no overcurrent is flowing through the switching element; and
a soft turnoff unit configured to discharge the open-close control terminal of the switching element at a second discharging rate to thereby forcibly turn off the switching element upon it being determined that an overcurrent is flowing through the switching element, the second discharging rate being lower than the first discharging rate.

10. An overcurrent determining apparatus applicable to a switching circuit that includes:
at least first and second switching elements parallely connected to each other, each of the at least first and second switching elements having first and second main terminals and an open-close control terminal; and
a charging unit configured to supply electrical charge to the open-close control terminal of each of the at least first and second switching elements to thereby charge the open-close control terminal,
the overcurrent determining apparatus being configured to execute an overcurrent determination routine to determine whether an overcurrent is flowing through the pair of first and second main terminals of each of the at least first and second switching elements based on whether a predetermined condition that a terminal voltage at the open-close control terminal of the corresponding one of the at least first and second switching elements is higher than a determination voltage is satisfied, the overcurrent determining apparatus comprising:
a temperature obtainer configured to obtain at least first and second temperature parameters respectively indicative of temperatures of the at least first and second switching elements, the at least first and second temperature parameters being respectively referred to as at least first and second temperature measurement values; and
a setter having correlation data indicative of a relationship between the determination voltage and each of the at least first and second temperature measurement values such that, the higher each of the at least first and second temperature measurement values is, the lower the determination voltage is,
the setter being configured to commonly set a value of the determination voltage for each of the at least first and second switching elements to a selected value on the correlation data, the selected value corresponding to the lowest value in the at least first and second temperature measurement values.

11. The overcurrent determining apparatus according to claim 10, wherein:
the charging unit has a charging terminal for charging the open-close control terminal of each of the at least first and second switching elements; and
the open-close control terminal of each of the at least first and second switching elements is connected to the charging terminal of the charging unit,
the overcurrent determining apparatus further comprising:
a voltage obtainer configured to obtain a voltage at the charging terminal to thereby obtain the terminal voltage of each of the at least first and second switching elements.

12. The overcurrent determining apparatus according to claim 11, further comprising:
a current parameter obtainer configured to obtain an inter-terminal current parameter indicative of the inter-terminal current for each of the at least first and second switching elements; and
a determiner configured to:
determine, for at least one of the at least first and second switching elements, whether:
a first condition, which is the condition, that the terminal voltage of the at least one of the at least first and second switching elements obtained by the voltage obtainer is higher than the determination voltage is satisfied; and
a second condition that a value of the corresponding inter-terminal current parameter of the at least one of the first and second switching elements is higher than a current-related determination value is satisfied; and
determine that an overcurrent is flowing through the at least one of the at least first and second switching elements upon determining that the first and second conditions are satisfied.

13. The overcurrent determining apparatus according to claim 12, further comprising:
a normal turnoff unit configured to discharge the open-close control terminal of each of the first and second switching elements at a first discharging rate upon it being determined that no overcurrent is flowing through each of the at least first and second switching elements; and
a soft turnoff unit configured to discharge the open-close control terminal of the at least one of the at least first and second switching elements at a second discharging rate to thereby forcibly turn off the at least one of the at least first and second switching elements upon it being determined that an overcurrent is flowing through the at least one of the at least first and second switching elements, the second discharging rate being lower than the first discharging rate.

14. A drive unit comprising:
a switching circuit that includes:
- a switching element having first and second main terminals and an open-close control terminal; and
- a charging unit configured to supply electrical charge to the open-close control terminal of the switching element to thereby charge the open-close control terminal; and a drive controller configured to:
- execute an overcurrent determination routine to determine whether an overcurrent is flowing through the pair of first and second main terminals of the switching element based on whether a predetermined condition that a terminal voltage at the open-close control terminal of the switching element is higher than a determination voltage is satisfied;
- obtain a temperature parameter indicative of a temperature of the switching element as a temperature measurement value, the determination voltage having a first voltage value when the temperature measurement value is a first temperature; and
- set the determination voltage to a second voltage value upon determining that the temperature measurement value is a second temperature higher than the first temperature, the second voltage value being lower than the first voltage value and higher than a value of a Miller voltage of the switching element at the second temperature.

* * * * *